United States Patent
Koyama et al.

(10) Patent No.: US 10,008,929 B2
(45) Date of Patent: Jun. 26, 2018

(54) DC-DC CONVERTER AND SEMICONDUCTOR DEVICE

(71) Applicant: Semiconductor Energy Laboratory Co., Ltd., Atsugi-shi, Kanagawa-ken (JP)

(72) Inventors: Jun Koyama, Kanagawa (JP); Kei Takahashi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 22 days.

(21) Appl. No.: 15/176,252

(22) Filed: Jun. 8, 2016

(65) Prior Publication Data

US 2016/0285369 A1    Sep. 29, 2016

Related U.S. Application Data

(63) Continuation of application No. 14/445,370, filed on Jul. 29, 2014, now Pat. No. 9,412,762.

(30) Foreign Application Priority Data

Jul. 31, 2013  (JP) ................................ 2013-159086

(51) Int. Cl.
  *H02M 3/156* (2006.01)
  *H01L 27/12* (2006.01)
  (Continued)

(52) U.S. Cl.
  CPC .......... *H02M 3/156* (2013.01); *G09G 3/2092* (2013.01); *H01L 27/1222* (2013.01);
  (Continued)

(58) Field of Classification Search
  CPC ................................................ G11C 27/026
  See application file for complete search history.

(56) References Cited

U.S. PATENT DOCUMENTS 4,769,753 A    9/1988  Knudson et al.
4,914,375 A    4/1990  Hatanaka
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Charles Garber
*Assistant Examiner* — Alia Sabur
(74) *Attorney, Agent, or Firm* — Fish & Richardson P.C.

(57) ABSTRACT

A DC-DC converter with low power consumption and high power conversion efficiency is provided. The DC-DC converter includes a first transistor and a control circuit. The control circuit includes an operational amplifier generating a signal that controls switching of the first transistor, a bias circuit generating a bias potential supplied to the operational amplifier, and a holding circuit holding the bias potential. The holding circuit includes a second transistor and a capacitor to which the bias potential is supplied. The first transistor and the second transistor include a first oxide semiconductor film and a second oxide semiconductor film, respectively. The first oxide semiconductor film and the second oxide semiconductor film each contain In, M (M is Ga, Y, Zr, La, Ce, or Nd), and Zn. The atomic ratio of In to M in the first oxide semiconductor film is higher than that in the second oxide semiconductor film.

19 Claims, 14 Drawing Sheets

(51) Int. Cl.
*H01L 29/786* (2006.01)
*H03K 7/08* (2006.01)
*G09G 3/20* (2006.01)
*H02M 3/335* (2006.01)

(52) U.S. Cl.
CPC ...... *H01L 27/1225* (2013.01); *H01L 29/7869* (2013.01); *H01L 29/78696* (2013.01); *H02M 3/33523* (2013.01); *H02M 3/33553* (2013.01); *H03K 7/08* (2013.01)

(56) References Cited

U.S. PATENT DOCUMENTS

| | | |
|---|---|---|
| 5,365,083 A | 11/1994 | Tada |
| 5,694,030 A | 12/1997 | Sato et al. |
| 5,727,193 A | 3/1998 | Takeuchi |
| 5,731,856 A | 3/1998 | Kim et al. |
| 5,744,864 A | 4/1998 | Cillessen et al. |
| 5,946,207 A | 8/1999 | Schoofs |
| 6,294,274 B1 | 9/2001 | Kawazoe et al. |
| 6,326,772 B2 | 12/2001 | Kusumoto et al. |
| 6,433,609 B1 | 8/2002 | Voldman |
| 6,549,429 B2 | 4/2003 | Konno |
| 6,563,174 B2 | 5/2003 | Kawasaki et al. |
| 6,724,156 B2 | 4/2004 | Fregoso |
| 6,727,522 B1 | 4/2004 | Kawasaki et al. |
| 6,798,180 B2 | 9/2004 | Sase et al. |
| 6,940,482 B2 | 9/2005 | Ishii et al. |
| 6,969,959 B2 | 11/2005 | Black et al. |
| 7,005,762 B2 | 2/2006 | Black |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,138,698 B2 | 11/2006 | Nakamura et al. |
| 7,205,727 B2 | 4/2007 | Takeshita et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,342,764 B2 | 3/2008 | Black et al. |
| 7,358,627 B2 | 4/2008 | Black et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,480,128 B2 | 1/2009 | Black |
| 7,501,293 B2 | 3/2009 | Ito et al. |
| 7,504,805 B2 | 3/2009 | Nishida |
| 7,557,459 B2 | 7/2009 | Yamashita et al. |
| 7,601,984 B2 | 10/2009 | Sano et al. |
| 7,656,946 B2 | 2/2010 | Morishima |
| 7,674,650 B2 | 3/2010 | Akimoto et al. |
| 7,679,942 B2 | 3/2010 | Nishida |
| 7,719,817 B2 | 5/2010 | Newman |
| 7,732,819 B2 | 6/2010 | Akimoto et al. |
| 7,737,773 B2 | 6/2010 | Kanamori et al. |
| 7,859,815 B2 | 12/2010 | Black et al. |
| 7,910,490 B2 | 3/2011 | Akimoto et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,710,762 B2 | 4/2014 | Takahashi et al. |
| 8,736,371 B2 | 5/2014 | Ohnuki |
| 8,797,440 B2 | 8/2014 | Matsuura |
| 9,172,237 B2 | 10/2015 | Sato |
| 9,543,835 B2 | 1/2017 | Takahashi et al. |
| 9,742,356 B2 | 8/2017 | Takahashi et al. |
| 2001/0010638 A1 | 8/2001 | Konno |
| 2001/0046027 A1 | 11/2001 | Tai et al. |
| 2002/0056838 A1 | 5/2002 | Ogawa |
| 2002/0060560 A1 | 5/2002 | Umemoto |
| 2002/0110006 A1 | 8/2002 | Mao et al. |
| 2002/0132454 A1 | 9/2002 | Ohtsu et al. |
| 2002/0185994 A1 | 12/2002 | Kanouda et al. |
| 2003/0006710 A1 | 1/2003 | Black et al. |
| 2003/0043090 A1 | 3/2003 | Yazawa et al. |
| 2003/0160744 A1 | 8/2003 | Yoshida et al. |
| 2003/0174009 A1* | 9/2003 | Kimura ............ H03K 19/00384 327/427 |
| 2003/0189401 A1 | 10/2003 | Kido et al. |
| 2003/0197494 A1 | 10/2003 | Kanouda et al. |
| 2003/0218222 A1 | 11/2003 | Wager, III et al. |
| 2004/0038446 A1 | 2/2004 | Takeda et al. |
| 2004/0080501 A1 | 4/2004 | Koyama |
| 2004/0127038 A1 | 7/2004 | Carcia et al. |
| 2004/0146101 A1 | 7/2004 | Pearce |
| 2005/0012698 A1 | 1/2005 | Takahashi |
| 2005/0017302 A1 | 1/2005 | Hoffman |
| 2005/0110719 A1 | 5/2005 | Satoh et al. |
| 2005/0116655 A1 | 6/2005 | Yazawa |
| 2005/0199959 A1 | 9/2005 | Chiang et al. |
| 2005/0264228 A1 | 12/2005 | Kim |
| 2006/0035452 A1 | 2/2006 | Carcia et al. |
| 2006/0043377 A1 | 3/2006 | Hoffman et al. |
| 2006/0044772 A1 | 3/2006 | Miura |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119186 A1 | 6/2006 | Black |
| 2006/0119187 A1 | 6/2006 | Newman |
| 2006/0119292 A1 | 6/2006 | Black et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0029977 A1 | 2/2007 | Asada |
| 2007/0046191 A1 | 3/2007 | Saito |
| 2007/0052025 A1 | 3/2007 | Yabuta |
| 2007/0054507 A1 | 3/2007 | Kaji et al. |
| 2007/0085515 A1 | 4/2007 | Nishida |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0182395 A1 | 8/2007 | Sakai et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0024012 A1 | 1/2008 | Qahouq et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0094010 A1 | 4/2008 | Black |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |

(56) References Cited

U.S. PATENT DOCUMENTS

| | | |
|---|---|---|
| 2008/0182358 A1 | 7/2008 | Cowdery-Corvan et al. |
| 2008/0224133 A1 | 9/2008 | Park et al. |
| 2008/0252277 A1 | 10/2008 | Sase et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0009505 A1 | 1/2009 | Koyama |
| 2009/0009704 A1 | 1/2009 | Tomikawa |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0128219 A1 | 5/2009 | Umemoto |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0045110 A1 | 2/2010 | Liu et al. |
| 2010/0065844 A1 | 3/2010 | Tokunaga |
| 2010/0066325 A1 | 3/2010 | Shionoiri |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0140705 A1 | 6/2010 | Wu et al. |
| 2010/0231055 A1 | 9/2010 | Black et al. |
| 2010/0320458 A1 | 12/2010 | Umeda et al. |
| 2010/0320459 A1 | 12/2010 | Umeda et al. |
| 2011/0074508 A1 | 3/2011 | Imura |
| 2011/0193083 A1 | 8/2011 | Kim et al. |
| 2011/0215328 A1 | 9/2011 | Morosawa et al. |
| 2011/0254523 A1 | 10/2011 | Ito et al. |
| 2011/0304311 A1* | 12/2011 | Takahashi ........... H01L 27/1225 323/311 |
| 2012/0032162 A1* | 2/2012 | Matsubayashi .... G11C 16/0433 257/43 |
| 2012/0119205 A1 | 5/2012 | Taniguchi et al. |
| 2013/0234621 A1 | 9/2013 | Athalye |
| 2013/0271220 A1 | 10/2013 | Takahashi et al. |
| 2014/0264638 A1 | 9/2014 | Frank et al. |
| 2018/0102741 A1 | 4/2018 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-069014 A | 3/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-147830 A | 7/2010 |
| JP | 2011-239664 A | 11/2011 |
| JP | 2012-019682 A | 1/2012 |
| JP | 2012-114578 A | 6/2012 |
| JP | 2012-257212 A | 12/2012 |
| JP | 2012-257447 A | 12/2012 |
| JP | 2013-235564 A | 11/2013 |
| WO | WO-2004/114391 | 12/2004 |
| WO | WO-2011/129209 | 10/2011 |
| WO | WO-2011/155295 | 12/2011 |
| WO | WO-2012/157463 | 11/2012 |
| WO | WO-2014/125820 | 8/2014 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1803-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Emplying MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 AND Sc2O3—A2O3—BO Systems [A; Fe, Ga, or Al; B: Mg, Mn, Fe, Ni, Cu,or Zn]at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphus In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

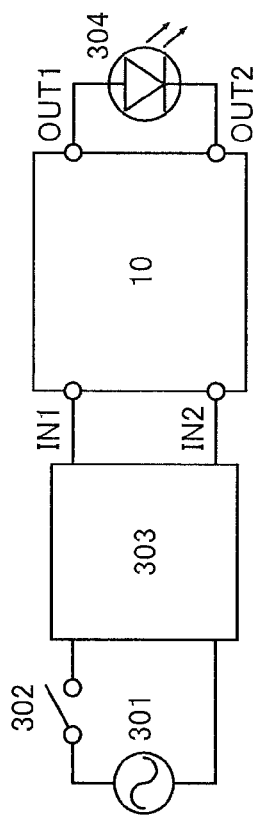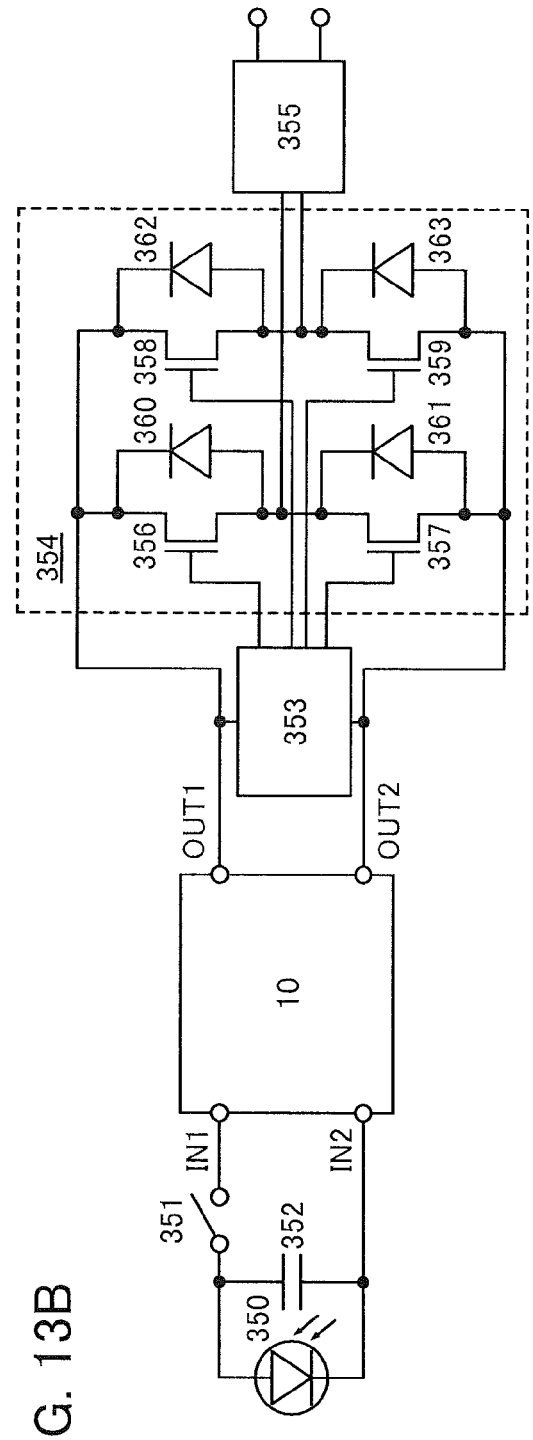
FIG. 13A
FIG. 13B

DC-DC CONVERTER AND SEMICONDUCTOR DEVICE

CROSS-REFERENCE TO RELATED APPLICATIONS

This application is a continuation of U.S. application Ser. No. 14/445,370, filed Jul. 29, 2014, now allowed, which claims the benefit of a foreign priority application filed in Japan as Serial No. 2013-159086 on Jul. 31, 2013, both of which are incorporated by reference.

BACKGROUND OF THE INVENTION

1. Field of the Invention

One embodiment of the present invention relates to a semiconductor device. In particular, one embodiment of the present invention relates to a DC-DC converter and a semiconductor device using the DC-DC converter.

2. Description of the Related Art

A metal oxide having semiconductor characteristics called an oxide semiconductor has attracted attention as a novel semiconductor. A transistor using an oxide semiconductor is under development. For example, the structure of a DC-DC converter using the transistor is disclosed in Patent Document 1.

REFERENCE

Patent Document

[Patent Document 1] Japanese Published Patent Application No. 2011-239664

SUMMARY OF THE INVENTION

A DC-DC converter is a constant-voltage circuit with which a constant output voltage can be obtained regardless of the value of an input voltage, and the DC-DC converter is used for a power supply circuit together with a rectification circuit or the like. A switching type DC-DC converter outputs a voltage with a desired value in such a manner that a voltage with a pulse waveform is formed using an input voltage by a switching element and the voltage is smoothed or held in a coil, a capacitor, or the like. The percentage of a period during which the switching element is on within a certain length of a period, what is called a duty ratio, can be controlled by a control circuit in the DC-DC converter. Control of the duty ratio by the control circuit makes it possible to control the value of an output voltage.

Although having higher power conversion efficiency than the linear type one, the switching type DC-DC converter needs even higher power conversion efficiency to reduce power consumption of a semiconductor device. Particularly in the case of a portable electronic device using power accumulated in a capacitor or a battery such as a primary battery or a secondly battery, the DC-DC converter is necessarily used to convert a voltage output from the battery, the capacitor, or the like into a voltage of an optimal level. Improvement of power conversion efficiency of the DC-DC converter leads to lower power consumption of a semiconductor device and a long continuous use time of a portable electronic device using the semiconductor device.

In view of the foregoing technical background, an object of one embodiment of the present invention is to provide a novel DC-DC converter and a semiconductor device using the DC-DC converter. Another object of one embodiment of the present invention is to provide a DC-DC converter with low power consumption and a semiconductor device using the DC-DC converter. Another object of one embodiment of the present invention is to provide a DC-DC converter with high power conversion efficiency and a semiconductor device using the DC-DC converter.

As a control circuit of the DC-DC converter, a circuit including an operational amplifier, such as an error amplifier or a comparator, is used. In the operational amplifier, a transistor functioning as a current source is provided. In one embodiment of the present invention, attention is focused on a bias circuit which applies a predetermined bias potential between a gate and a source of the transistor, and the bias potential is held by a transistor with low off-state current; thus, power consumption of the bias circuit due to the steady current is reduced.

A transistor in which a channel formation region is formed in a film of a semiconductor having a wider band gap and lower intrinsic carrier density than silicon, such as an oxide semiconductor (hereinafter such a transistor is referred to as an OS transistor), can have higher withstand voltage and significantly lower off-state current than a transistor formed using a normal semiconductor such as silicon or germanium. In one embodiment of the present invention, an OS transistor is used to hold a bias potential.

In addition, the DC-DC converter includes a switching element having a function of forming a voltage with a pulse waveform on the basis of an input voltage. To ensure the reliability of the DC-DC converter, the switching element needs high withstand voltage. For this reason, in one embodiment of the present invention, an OS transistor is used as the switching element.

Note that the OS transistor for holding a bias potential needs low off-state current. Meanwhile, to increase the power conversion efficiency of the DC-DC converter, the OS transistor used as the switching element needs high on-state current in addition to high withstand voltage. For this reason, in one embodiment of the present invention, to achieve both low power consumption and high power conversion efficiency, the OS transistors have different structures depending on required characteristics.

Specifically, in a DC-DC converter of one embodiment of the present invention, an OS transistor for holding a bias potential includes a first oxide semiconductor film and an OS transistor functioning as a switching element includes a second oxide semiconductor film.

In the first structure of the present invention, the first oxide semiconductor film and the second oxide semiconductor film contain an In—M—Zn oxide (M is Ga, Y, Zr, La, Ce, or Nd); the atomic ratio of In to M (In/M) in the second oxide semiconductor film is higher than that in the first oxide semiconductor film.

In the second structure of the present invention, the first oxide semiconductor film contains an In—M—Zn oxide (M is Ga, Y, Zr, La, Ce, or Nd), and the second oxide semiconductor film contains an In—Zn oxide, an In oxide, or a Zn oxide.

In the third structure of the present invention, the OS transistor for holding a bias potential includes a pair of gate electrodes between which the first oxide semiconductor film is provided; a potential of a signal for controlling the switching of the OS transistor is supplied to one of the gate electrodes, and a low-level power supply potential of the power supply potentials supplied to the DC-DC converter is supplied to the other of the gate electrodes. Furthermore, in the third structure of the present invention, the OS transistor used as the switching element includes a pair of gate electrodes between which the second oxide semiconductor film is provided; the pair of gate electrodes is electrically connected to each other.

One embodiment of the present invention makes it possible to provide a novel DC-DC converter and a semiconductor device using the DC-DC converter. One embodiment of the present invention makes it possible to provide a DC-DC converter with low power consumption and a semiconductor device using the DC-DC converter. One embodiment of the present invention makes it possible to provide a DC-DC converter with high power conversion efficiency and a semiconductor device using the DC-DC converter.

BRIEF DESCRIPTION OF THE DRAWINGS

FIGS. 13A and 13B each illustrate a configuration example of a semiconductor device.

DETAILED DESCRIPTION OF THE INVENTION

Figure 1A:
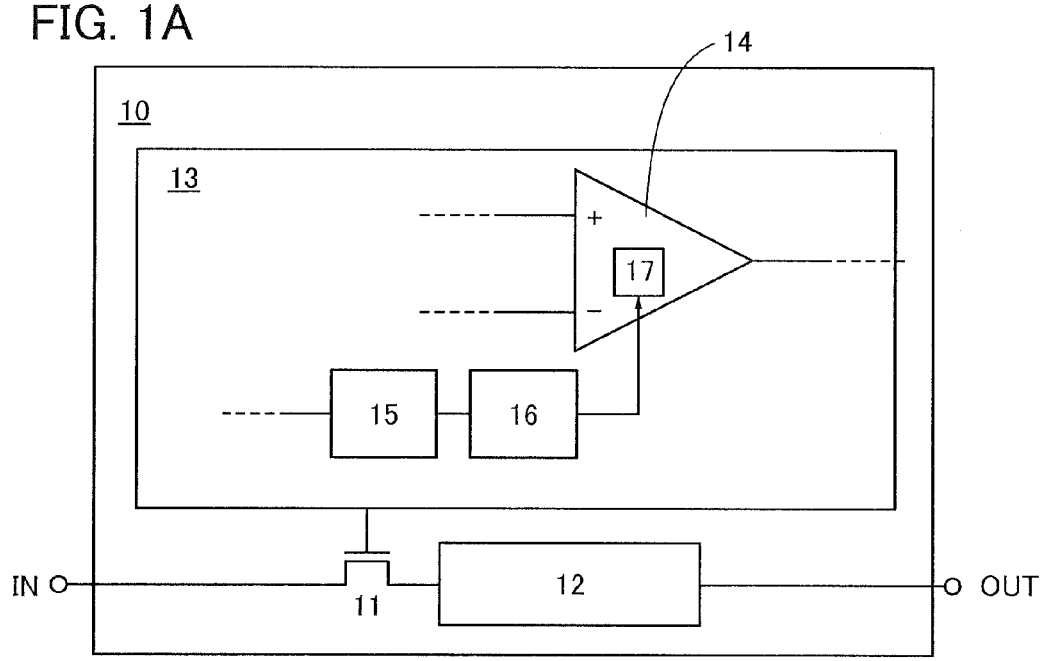
FIGS. 1A and 1B illustrate a configuration of a DC-DC converter.

Embodiments of the present invention will be described below in detail with reference to the drawings. Note that the present invention is not limited to the following description. It is easily understood by those skilled in the art that the mode and details can be variously changed without departing from the spirit and scope of the present invention. Therefore, the present invention should not be construed as being limited to the description of the embodiments below.

Note that one embodiment of the present invention includes, in its category, semiconductor devices which can use a DC-DC converter, such as an integrated circuit, an RF tag, a storage medium, a solar cell, a lighting device using a light-emitting element, a semiconductor display device, and a power supply circuit. The integrated circuit includes, in its category, large scale integrated circuits (LSIs) including a microprocessor, an image processing circuit, a digital signal processor (DSP), and a microcontroller, and programmable logic devices (PLDs) such as a field programmable gate array (FPGA) and a complex PLD (CPLD). In addition, the semiconductor display device includes, in its category, semiconductor display devices in which a DC-DC converter is included in a driver circuit, such as a liquid crystal display device, a light-emitting device in which a light-emitting element typified by an organic light-emitting element (OLED) is provided for each pixel, an electronic paper, a digital micromirror device (DMD), a plasma display panel (PDP), and a field emission display (FED).

Note that the term "connection" in this specification refers to electrical connection and corresponds to a state in which current, voltage, or a potential can be supplied or transmitted. Accordingly, a connection state means not only a state of direct connection but also a state of electrical connection through a circuit element such as a wiring, a resistor, a diode, or a transistor so that current, voltage, or a potential can be supplied or transmitted.

In addition, even when different components are connected to each other in a circuit diagram, there is actually a case where one conductive film has functions of a plurality of components such as a case where part of a wiring functions as an electrode. The term "connection" also means such a case where one conductive film has functions of a plurality of components.

A "source" of a transistor means a source region that is part of a semiconductor film functioning as an active layer or a source electrode that is electrically connected to the semiconductor film. Similarly, a "drain" of a transistor means a drain region that is part of a semiconductor film functioning as an active layer or a drain electrode that is electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

<Configuration Example 1 of DC-DC Converter>

FIG. 1A illustrates an example of a configuration of a DC-DC converter of one embodiment of the present invention.

A DC-DC converter 10 illustrated in FIG. 1A includes a transistor 11, a smoothing circuit 12, and a control circuit 13.

The transistor 11 functions as a switching element which controls supply of an input potential applied to an input terminal IN to the smoothing circuit 12. Specifically, the input potential is supplied to the smoothing circuit 12 when the transistor 11 is on. In addition, the supply of the input potential to the smoothing circuit 12 is stopped when the transistor 11 is off. When the transistor 11 is turned off, a reference potential such as a ground potential is applied to the smoothing circuit 12. Thus, a signal having a pulse waveform with which the input potential and the reference potential alternately appear in accordance with on/off selection, the switching, of the transistor 11 is supplied to the smoothing circuit 12.

Although FIG. 1A illustrates an example in which the one transistor 11 is used as one switching element, a plurality of transistors 11 may be used as one switching element. In the case where the plurality of transistors 11 are used as one switching element, the plurality of transistors 11 may be connected in parallel to one another, in series to one another, or in combination of parallel connection and series connection.

Note that in this specification, a state in which transistors are connected in series to each other means, for example, a state in which only one of a source and a drain of a first transistor is connected to only one of a source and a drain of a second transistor. In addition, a state in which transistors are connected in parallel to each other means a state in which one of a source and a drain of a first transistor is connected to one of a source and a drain of a second transistor and the other of the source and the drain of the first transistor is connected to the other of the source and the drain of the second transistor.

The smoothing circuit 12 has a function of smoothing the potential of the signal with the pulse waveform and supplying the smoothed potential to an output terminal OUT as an output potential. Specifically, the smoothing circuit 12 includes one or more of a coil, a capacitor, and a diode.

The control circuit 13 has a function of controlling the ratio of on time to off time of the transistor 11. The control circuit 13 controls the ratio of on time to off time of the transistor 11, whereby in the signal with the pulse waveform that is supplied to the smoothing circuit 12, the percentage of a period during which a pulse appears (such a percentage is called a duty ratio) can be controlled.

When the duty ratio changes, the output potential changes. Specifically, as the percentage of a period during which a pulse of the input potential appears is increased, a difference between the output potential and the reference potential becomes larger. In contrast, as the percentage of the period during which a pulse of the input potential appears is decreased, a difference between the output potential and the reference potential becomes smaller.

Note that in one embodiment of the present invention, the output potential can be adjusted by the switching of the transistor 11 with the use of a combination of the pulse width control and the pulse frequency control. For example, when the output potential is low, the frequency of the switching of the transistor 11 can be reduced by using the pulse frequency control rather than the pulse width control; accordingly, power loss due to the switching of the transistor 11 can be reduced. In contrast, when the output potential is high, the frequency of the switching of the transistor 11 can be reduced by using the pulse width control rather than the pulse frequency control; accordingly, power loss due to the switching of the transistor 11 can be reduced. The pulse width control and the pulse frequency control are switched depending on the amount of the output potential; thus, power conversion efficiency can be increased.

In the control circuit 13, specifically, any of various circuits using an operational amplifier, such as an error amplifier or a comparator, is used. FIG. 1A illustrates an operational amplifier 14 included in the control circuit 13. The operational amplifier 14 generally includes a current source 17. In one embodiment of the present invention, as illustrated in FIG. 1A, the control circuit 13 includes a bias circuit 15 having a function of supplying a bias potential to the current source 17 of the operational amplifier 14, and a holding circuit 16 having a function of holding the bias potential.

Figure 1B:
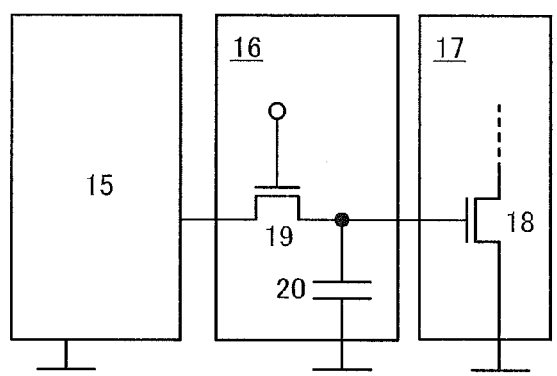

FIG. 1B illustrates the bias circuit 15, the holding circuit 16, and the current source 17 included in the operational amplifier 14. The bias potential generated in the bias circuit 15 is supplied to the current source 17 through the holding circuit 16. The current source 17 includes a transistor 18. The bias potential supplied from the bias circuit 15 is specifically supplied to a gate of the transistor 18 in the current source 17.

The holding circuit 16 includes a transistor 19 and a capacitor 20. The transistor 19 functions as a switching element controlling the supply of the bias potential, which is output from the bias circuit 15, to the capacitor 20 and the current source 17. Specifically, the bias potential is supplied to the capacitor 20 and the current source 17 when the transistor 19 is on. The supply of the bias potential to the capacitor 20 is stopped when the transistor 19 is off. When the transistor 19 is turned off, the bias potential is held in the capacitor 20 and the held bias potential is supplied to the current source 17.

One embodiment of the present invention includes the holding circuit 16 and thus the bias potential can be successively supplied to the current source 17 without constant generation of the bias potential in the bias circuit 15. Accordingly, in a period during which the bias potential is held in the holding circuit 16, operation of the bias circuit 15 can be stopped. In other words, during the operation of the bias circuit 15, it is possible to stop flow of current between wirings which are connected to the bias circuit 15. In the above manner, in one embodiment of the present invention, power consumption of the control circuit 13 can be reduced, achieving low power consumption of the DC-DC converter 10.

Note that the transistor 19 used in the holding circuit 16 preferably has low off-state current, in which case electrical charges accumulated in the capacitor 20 hardly leak through the transistor 19 and thus the period during which the bias potential is held can be prolonged. An OS transistor in which a channel formation region is formed in an oxide semiconductor film having a wider band gap and lower intrinsic carrier density than silicon can have significantly lower off-state current than a transistor formed using a semiconductor such as silicon or germanium, and therefore is preferably used as the transistor 19.

Note that off-state current in this specification refers to current flowing in a cut-off region between a source and a drain of a transistor, unless otherwise specified.

Furthermore, because of the wide band gap of the oxide semiconductor film, the OS transistor has higher withstand voltage than a transistor formed using a semiconductor such as silicon or germanium, in addition to the extremely low off-state current. The transistor 11 controlling the supply of the input potential, which is applied to the input terminal IN, to the smoothing circuit 12 needs high withstand voltage. For this reason, the use of the OS transistor as the transistor 11 enables the DC-DC converter 10 to have high reliability.

Note that to increase the power conversion efficiency of the DC-DC converter 10, power loss due to the resistance between a source and a drain when the transistor 11 is on, i.e., on-state resistance, needs to be reduced. Thus, to increase the power conversion efficiency of the DC-DC converter 10, the transistor 11 needs to have an electrical characteristic of high on-state current rather than an electrical characteristic of low off-state current.

For this reason, in one embodiment of the present invention, to achieve both low power consumption and high power conversion efficiency, OS transistors have different structures depending on required characteristics. Specifically, in the DC-DC converter 10 of one embodiment of the present invention, the transistor 19 for holding the bias potential includes a first oxide semiconductor film, and the transistor 11 controlling the supply of the input potential to the smoothing circuit 12 includes a second oxide semiconductor film.

In the first structure of the present invention, the first oxide semiconductor film and the second oxide semiconductor film contain an In—M—Zn oxide (M is Ga, Y, Zr, La, Ce, or Nd); the atomic ratio of In to M (In/M) in the second oxide semiconductor film is higher than that in the first oxide semiconductor film. When the atomic ratio of In to M (In/M) is high, carrier mobility is high; thus, the transistor 11 including the second oxide semiconductor film can have higher on-state current than the transistor 19. When the atomic ratio of In to M (In/M) is low, carrier mobility is low; thus, the transistor 19 including the first oxide semiconductor film can have lower off-state current than the transistor 11.

Specifically, it is preferable that the first oxide semiconductor film and the second oxide semiconductor film contain an In—M—Zn oxide (M is Ga, Y, Zr, La, Ce, or Nd), and the atomic ratio of In to M and Zn, $x_1:y_1:z_1$, in a target for forming the first oxide semiconductor film and the atomic ratio of In to M and Zn, $x_2:y_2:z_2$, in a target for forming the second oxide semiconductor film satisfy $x_1/y_1 < x_2/y_2$. Furthermore, $x_1/y_1$ and $x_2/y_2$ are each preferably greater than or equal to ⅓ and less than or equal to 6, more preferably greater than or equal to 1 and less than or equal to 6. Typical examples of the atomic ratio of In to M and Zn in the target are 1:1:1 and 3:1:2.

In the second structure of the present invention, the first oxide semiconductor film contains an In—M—Zn oxide (M is Ga, Y, Zr, La, Ce, or Nd), and the second oxide semiconductor film contains an In—Zn oxide, an In oxide, or a Zn oxide. The second oxide semiconductor film containing the In—Zn oxide, the In oxide, or the Zn oxide has higher carrier mobility than the first oxide semiconductor film containing the In—M—Zn oxide (M is Ga, Y, Zr, La, Ce, or Nd). Accordingly, the transistor 19 including the first oxide semiconductor film can have lower off-state current than the transistor 11. In addition, the transistor 11 including the second oxide semiconductor film can have higher on-state current than the transistor 19.

In the case where an In—Zn oxide material is used as an oxide semiconductor, the composition ratio of In to Zn in a target of the In—Zn-based oxide is 50:1 to 1:2 in an atomic ratio ($In_2O_3$:ZnO=25:1 to 1:4 in a molar ratio), preferably 20:1 to 1:1 in an atomic ratio ($In_2O_3$:ZnO=10:1 to 1:2 in a molar ratio), more preferably 1.5:1 to 15:1 in an atomic ratio ($In_2O_3$:ZnO=3:4 to 15:2 in a molar ratio). For example, when the atomic ratio of In to Zn and O in a target used for formation of an oxide semiconductor film containing an In—Zn oxide is X:Y:Z, the relation of Z>1.5X+Y is satisfied. The mobility can be increased by keeping the ratio of Zn within the above range.

In the third structure of the present invention, the transistor 19 for holding the bias potential includes a pair of gate electrodes between which the first oxide semiconductor film is provided; a potential of a signal for controlling the switching of the transistor 19 is supplied to one of the gate electrodes, and a low-level reference potential of the potentials supplied to the DC-DC converter 10 is applied to the other of the gate electrodes. Supply of the low-level reference potential to the one of the pair of gate electrodes allows the threshold voltage of the transistor 19 to be shifted in the positive direction and makes the off-state current of the transistor 19 low. Furthermore, in the third structure of the present invention, the transistor 11 controlling the supply of the input potential to the smoothing circuit 12 includes a pair of gate electrodes between which the second oxide semiconductor film is provided; the pair of gate electrodes is electrically connected to each other. The pair of gate electrodes electrically connected to each other increases the area of a channel formation region in the second oxide semiconductor film, resulting in high on-state current of the transistor 11.

In one embodiment of the present invention, any of the first to third structures is used to reduce the off-state current of the transistor 19; thus, power consumption of the DC-DC converter 10 can be reduced. Furthermore, the use of any of the first to third structures also makes it possible to increase the on-state current of the transistor 11; accordingly, the power conversion efficiency of the DC-DC converter 10 can be increased.

<Structure Example of Transistor>

Figure 2A:
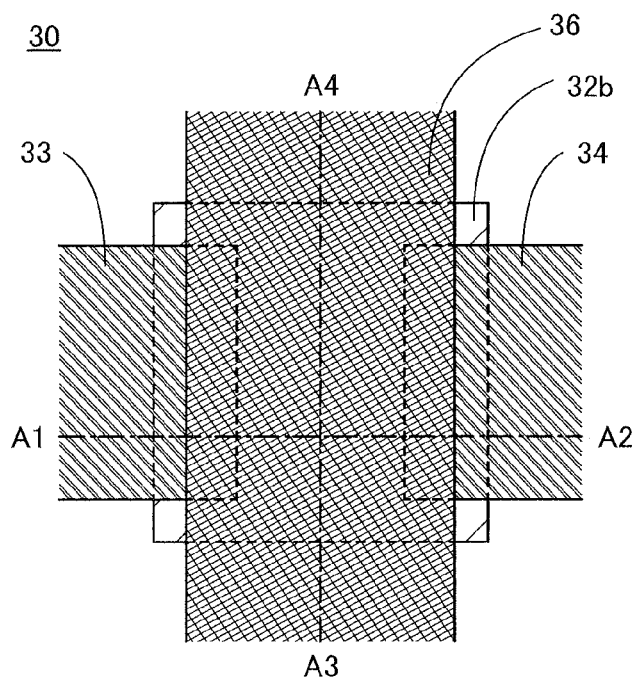
FIGS. 2A to 2C illustrate a structure of a transistor.
Figure 2C:
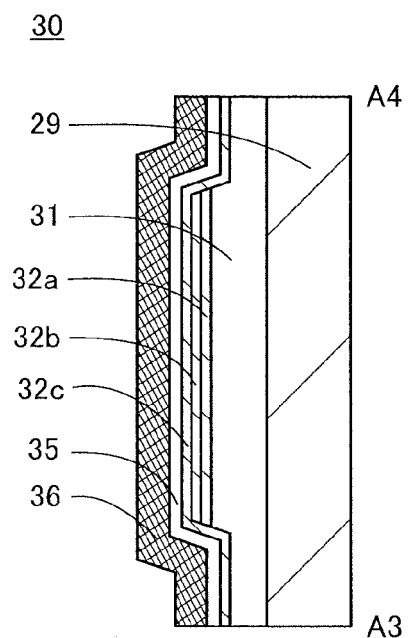
Figure 2B:
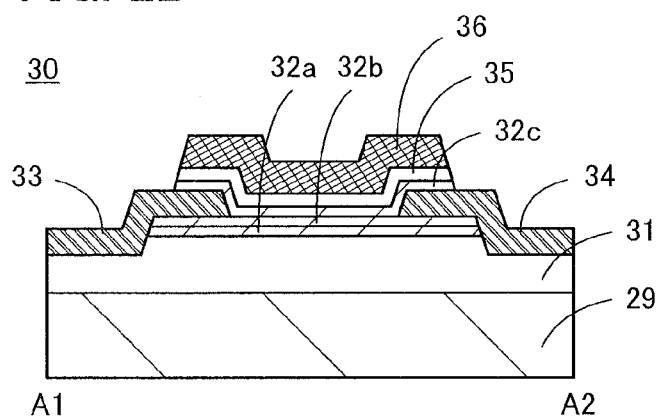

Next, FIGS. 2A to 2C illustrates a specific example of a structure of a transistor 30 that can be used as the transistor 11 or the transistor 19 illustrated in FIGS. 1A and 1B. FIG. 2A is a top view of the transistor 30. Note that insulating films are not illustrated in FIG. 2A in order to clarify the layout of the transistor 30. FIG. 2B is a cross-sectional view along the dashed line A1-A2 in the top view in FIG. 2A. FIG. 2C is a cross-sectional view along the dashed line A3-A4 in the top view in FIG. 2A.

As illustrated in FIGS. 2A to 2C, an insulating film 31 is formed over a substrate 29. The transistor 30 includes an oxide semiconductor film 32a and an oxide semiconductor film 32b which are stacked in this order over the insulating film 31; a conductive film 33 and a conductive film 34 which are electrically connected to the oxide semiconductor film 32b and function as a source electrode and a drain electrode; an oxide semiconductor film 32c over the oxide semiconductor film 32b, the conductive film 33, and the conductive film 34; an insulating film 35 which functions as a gate insulating film and is located over the oxide semiconductor film 32c; and a conductive film 36 which functions as a gate electrode and overlaps with the oxide semiconductor films 32a, 32b, and 32c over the insulating film 35.

Figure 3A:
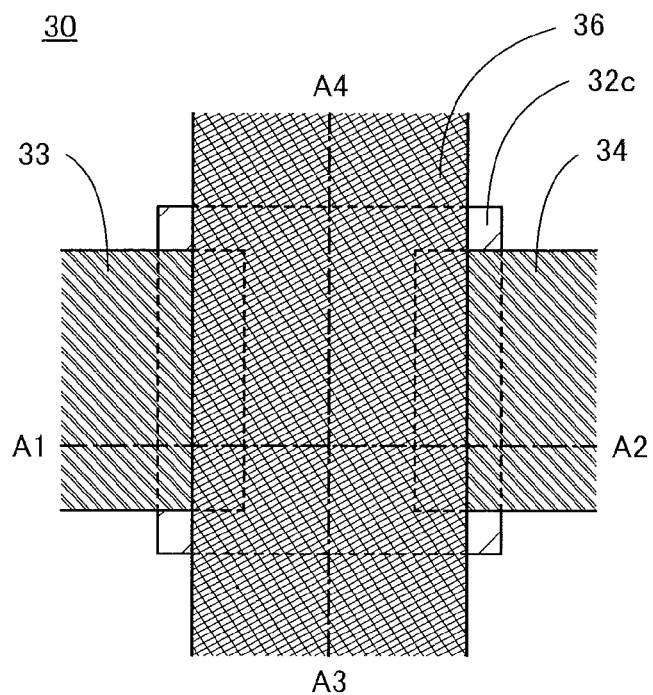
FIGS. 3A to 3C illustrate a structure of a transistor.
Figure 3C:
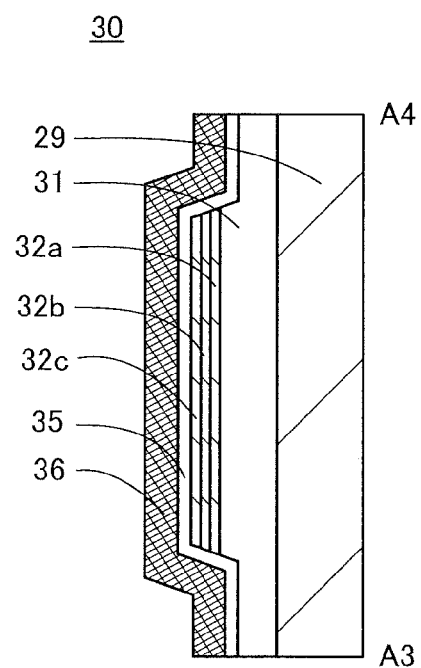
Figure 3B:
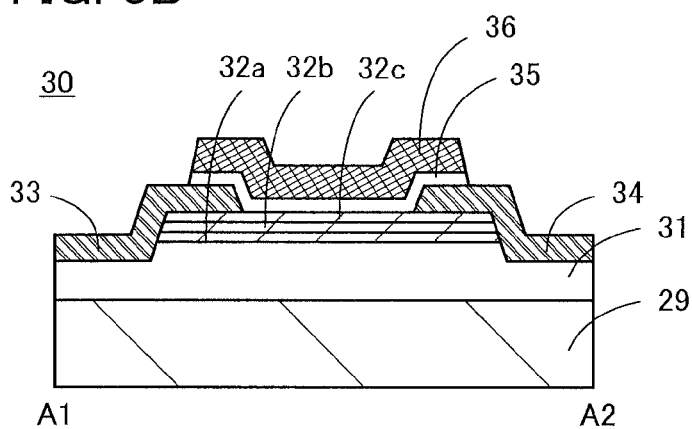

FIGS. 3A to 3C illustrates another specific example of the structure of the transistor 30 that can be used as the transistor 11 or the transistor 19 illustrated in FIGS. 1A and 1B. FIG. 3A is a top view of the transistor 30. Note that insulating films are not illustrated in FIG. 3A in order to clarify the layout of the transistor 30. FIG. 3B is a cross-sectional view along the dashed line A1-A2 in the top view in FIG. 3A. FIG. 3C is a cross-sectional view along the dashed line A3-A4 in the top view in FIG. 3A.

As illustrated in FIGS. 3A to 3C, the transistor 30 includes the oxide semiconductor films 32a, 32b, and 32c which are stacked in this order over the insulating film 31; the conductive film 33 and the conductive film 34 which are electrically connected to the oxide semiconductor film 32c and function as a source electrode and a drain electrode; the insulating film 35 which functions as a gate insulating film and is located over the oxide semiconductor film 32c, the conductive film 33, and the conductive film 34; and the conductive film 36 which functions as a gate electrode and overlaps with the oxide semiconductor films 32a, 32b, and 32c over the insulating film 35. The insulating film 31 is formed over the substrate 29.

In the first structure of the present invention, in the transistor 30 illustrated in each of FIGS. 2A to 2C and FIG. 3A to 3C, at least the oxide semiconductor film 32b among the oxide semiconductor films 32a, 32b, and 32c contains an In—M—Zn oxide (M is Ga, Y, Zr, La, Ce, or Nd), and the atomic ratio of In to M (In/M) varies depending on the usage of the transistor 30. Specifically, the transistor 30 used as the transistor 11, which needs high on-state current, includes the oxide semiconductor film 32b having the atomic ratio of In to M (In/M) higher than that of the oxide semiconductor film 32b in the transistor 30 used as the transistor 19, which needs low off-state current.

Specifically, in the case where the oxide semiconductor film 32b of the transistor 19 and the oxide semiconductor film 32b of the transistor 11 contain an In—M—Zn oxide (M is Ga, Y, Zr, La, Ce, or Nd), $x_1/y_1 < x_2/y_2$ is preferably satisfied when the atomic ratio of In to M and Zn in a target for forming the oxide semiconductor film 32b of the transistor 19 is $x_1:y_1:z_1$ and the atomic ratio of In to M and Zn in a target for forming the oxide semiconductor film 32b of the transistor 11 is $x_2:y_2:z_2$. Furthermore, $x_1/y_1$ and $x_2/y_2$ are each preferably greater than or equal to ⅓ and less than or equal to 6, more preferably greater than or equal to 1 and less than or equal to 6. Typical examples of the atomic ratio of In to M and Zn in the target are 1:1:1 and 3:1:2. Note that when $z_1/y_1$ is greater than or equal to 1 and less than or equal to 6, a CAAC-OS film to be described later as the oxide semiconductor layer 32b is easily formed.

With any of the above-described structures, the off-state current of the transistor 19 is reduced, and thus power consumption of the DC-DC converter 10 can be reduced. In addition, with any of the above-described structures, the on-state current of the transistor 11 is increased, and thus the power conversion efficiency of the DC-DC converter 10 can be increased.

FIGS. 2A to 2C and FIGS. 3A to 3C each illustrate the structure example of the transistor 30 in which the oxide semiconductor films 32a, 32b, and 32c are stacked. However, the structure of the oxide semiconductor film included in each of the transistors 11 and 19 is not limited to a stacked-layer structure including a plurality of oxide semiconductor films and may be a single-layer structure. When the oxide semiconductor film in each of the transistors 11 and 19 has a single-layer structure, the oxide semiconductor film in the transistor 11 may have the atomic ratio of In to M (In/M) higher than that of the oxide semiconductor film in the transistor 19.

Each of the oxide semiconductor films 32a and 32c is an oxide film that contains at least one of the metal elements contained in the oxide semiconductor film 32b and in which the conduction band minimum is closer to the vacuum level than that in the oxide semiconductor film 32b by higher than or equal to 0.05 eV, 0.07 eV, 0.1 eV, or 0.15 eV and lower than or equal to 2 eV, 1 eV, 0.5 eV, or 0.4 eV.

Specifically, in the case where the oxide semiconductor film 32a and the oxide semiconductor film 32c contain an In—M—Zn oxide (M is Ga, Y, Zr, La, Ce, or Nd), it is preferable that $x_3/y_3 < x_1/y_1$ and $x_3/y_3 < x_2/y_2$ be satisfied, and $z_3/y_3$ be greater than or equal to ⅓ and less than or equal to 6, more preferably greater than or equal to 1 and less than or equal to 6. Note that when $z_3/y_3$ is greater than or equal to 1 and less than or equal to 6, CAAC-OS films to be described later as the oxide semiconductor 32a and the oxide semiconductor film 32c are easily formed. Typical examples of the atomic ratio of In to M and Zn in the target include 1:3:2, 1:3:4, 1:3:6, and 1:3:8.

The oxide semiconductor film 32a and the oxide semiconductor film 32c each have a thickness greater than or equal to 3 nm and less than or equal to 100 nm, preferably greater than or equal to 3 nm and less than or equal to 50 nm. The thickness of the oxide semiconductor film 32b is greater than or equal to 3 nm and less than or equal to 200 nm, preferably greater than or equal to 3 nm and less than or equal to 100 nm, more preferably greater than or equal to 3 nm and less than or equal to 50 nm.

The three oxide semiconductor films (oxide semiconductor films 32a, 32b, and 32c) can be either amorphous or crystalline. However, when the oxide semiconductor film 32b where a channel region is formed is crystalline, the transistor 30 can have stable electrical characteristics; therefore, the oxide semiconductor film 32b is preferably crystalline.

Note that a channel formation region refers to a region of the semiconductor film of the transistor 30 that overlaps with the gate electrode and is located between the source electrode and the drain electrode. A channel region refers to a region through which current mainly flows in the channel formation region.

In the case where the transistor 30 includes the oxide semiconductor films 32a and 32c with the above structure, a channel region is formed in the oxide semiconductor film 32b having low conduction band minimum when voltage is applied to the gate. That is, the oxide semiconductor film 32c provided between the oxide semiconductor film 32b and the insulating film 35 makes it possible to form the channel region in the oxide semiconductor film 32b, which is separated from the insulating film 35.

Since the oxide semiconductor film 32c contains at least one of the metal elements contained in the oxide semiconductor film 32b, interface scattering is less likely to occur at the interface between the oxide semiconductor film 32b and the oxide semiconductor film 32c. Thus, the movement of carriers is less likely to be inhibited at the interface, which results in an increase in the field-effect mobility of the transistor 30.

When an interface level is formed at the interface between the oxide semiconductor film 32b and the oxide semiconductor film 32a, a channel region is formed also in the vicinity of the interface, which causes a change in the threshold voltage of the transistor 30. However, since the oxide semiconductor film 32a contains at least one of the metal elements contained in the oxide semiconductor film 32b, an interface level is less likely to be formed at the interface between the oxide semiconductor film 32b and the oxide semiconductor film 32a. Accordingly, the above structure allows reducing of variations in the electrical characteristics of the transistors 30, such as the threshold voltage.

Further, it is preferable that a plurality of oxide semiconductor films be stacked so that an interface level due to an impurity existing between the oxide semiconductor films, which inhibits carrier flow, is not formed at the interface between the oxide semiconductor films. This is because when an impurity exists between the stacked oxide semiconductor films, the continuity of the conduction band minimum between the oxide semiconductor films is lost, and carriers are trapped or disappear by recombination in the vicinity of the interface. By reducing an impurity existing between the films, a continuous junction (here, in particular, a U-shape well structure whose conduction band minimum is changed continuously between the films) is formed more easily than the case of merely stacking a plurality of oxide semiconductor films which contain at least one common metal as a main component.

In order to form such a continuous junction, the films need to be stacked successively without being exposed to the air by using a multi-chamber deposition system (sputtering apparatus) provided with a load lock chamber. Each chamber of the sputtering apparatus is preferably evacuated to a high vacuum (to approximately $5\times10^{-7}$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in sputtering is important. When an oxygen gas or an argon gas used as the above gas has a dew point of −40° C. or lower, preferably −80° C. or lower, more preferably −100° C. or lower and is highly purified, moisture and the like can be prevented from entering the oxide semiconductor film as much as possible.

Note that end portions of the semiconductor film in the transistor 30 may be tapered or rounded.

Furthermore, in the transistor 30, a metal in the source electrode and the drain electrode might extract oxygen from the oxide semiconductor film depending on a conductive material used for the source electrode and the drain electrode. In this case, regions of the oxide semiconductor film in contact with the source electrode and the drain electrode become n-type regions due to the formation of oxygen vacancies. The n-type regions serve as a source region and a drain region, resulting in a decrease in the contact resistance between the oxide semiconductor film and the source electrode and between the oxide semiconductor film and the drain electrode. Accordingly, the formation of the n-type regions increases the mobility and on-state current of the transistor, achieving high-speed operation of a semiconductor device using the transistor.

Note that the extraction of oxygen by a metal in the source electrode and the drain electrode is probably caused when the source electrode and the drain electrode are formed by a sputtering method or the like or when heat treatment is performed after the formation of the source electrode and the drain electrode. The n-type regions are more likely to be formed by forming the source electrode and the drain electrode with the use of a conductive material which is easily bonded to oxygen. Examples of such a conductive material include Al, Cr, Cu, Ta, Ti, Mo, and W.

The insulating film 31 preferably contains oxygen at a proportion higher than or equal to the stoichiometric composition and has a function of supplying part of oxygen to the oxide semiconductor films 32a, 32b, and 32c by heating. It is preferable that the number of defects in the insulating film 31 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 31, which has a function of supplying part of the oxygen to the oxide semiconductor films 32a, 32b, and 32c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 31 can be formed by a plasma chemical vapor deposition (CVD) method, a sputtering method, or the like.

Note that in this specification, oxynitride contains more oxygen than nitrogen, and nitride oxide contains more nitrogen than oxygen.

Note that in the transistor 30 illustrated in each of FIGS. 2A to 2C and FIGS. 3A to 3C, the conductive film 36 overlaps with end portions of the oxide semiconductor film 32b including a channel region that do not overlap with the conductive films 33 and 34, i.e., end portions of the oxide semiconductor film 32b that are in a region different from a region where the conductive films 33 and 34 are located.

When the end portions of the oxide semiconductor film 32b are exposed to plasma by etching for forming the end portions, chlorine radical, fluorine radical, or the like generated from an etching gas is easily bonded to a metal element contained in the oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be adjusted by controlling the potentials of the conductive film 36 because the end portions of the oxide semiconductor film 32b that do not overlap with the conductive films 33 and 34 overlap with the conductive film 36 in the transistor 30 illustrated in each of FIGS. 2A to 2C and FIGS. 3A to 3C. Consequently, the flow of current between the conductive film 33 and the conductive film 34 can be controlled by an electric field formed in the end portions of the oxide semiconductor film 32b in response to the application of the potential to the conductive film 36. Such a structure of the transistor 30 is referred to as a surrounded channel (s-channel) structure.

With the s-channel structure, specifically, when a potential at which the transistor 30 is turned off is applied to the conductive film 36, the amount of off-state current that flows between the conductive film 33 and the conductive film 34 can be reduced by an electric field formed in the end portions of the oxide semiconductor film 32b that do not overlap with the conductive films 33 and 34. For this reason, in the transistor 30, even when the distance between the conductive film 33 and the conductive film 34 over the top surface of the oxide semiconductor film 32b is reduced as a result of reducing the channel length to obtain high on-state current, the transistor 30 can have low off-state current. Consequently, with the short channel length, the transistor 30 can have high on-state current when in an on state and low off-state current when in an off state.

With the s-channel structure, specifically, when a potential at which the transistor 30 is turned on is applied to the conductive film 36, the amount of current that flows between the conductive film 33 and the conductive film 34 can be increased by an electric field formed in the end portions of the oxide semiconductor film 32b. The current contributes to an increase in the field-effect mobility and an increase in on-state current of the transistor 30. When the end portions of the oxide semiconductor film 32b overlap with the conductive film 36, carriers flow not only in part of the oxide semiconductor film that is in the vicinity of the interface between the oxide semiconductor film 32b and the oxide semiconductor film 32c but also in a wide region in the oxide semiconductor film 32b, which results in an increase in the number of carriers that move in the transistor 30. As a result, the on-state current of the transistor 30 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

<Configuration Example of Control Circuit>

A configuration example of a control circuit in the case of employing the pulse width control is described.

Figure 4:
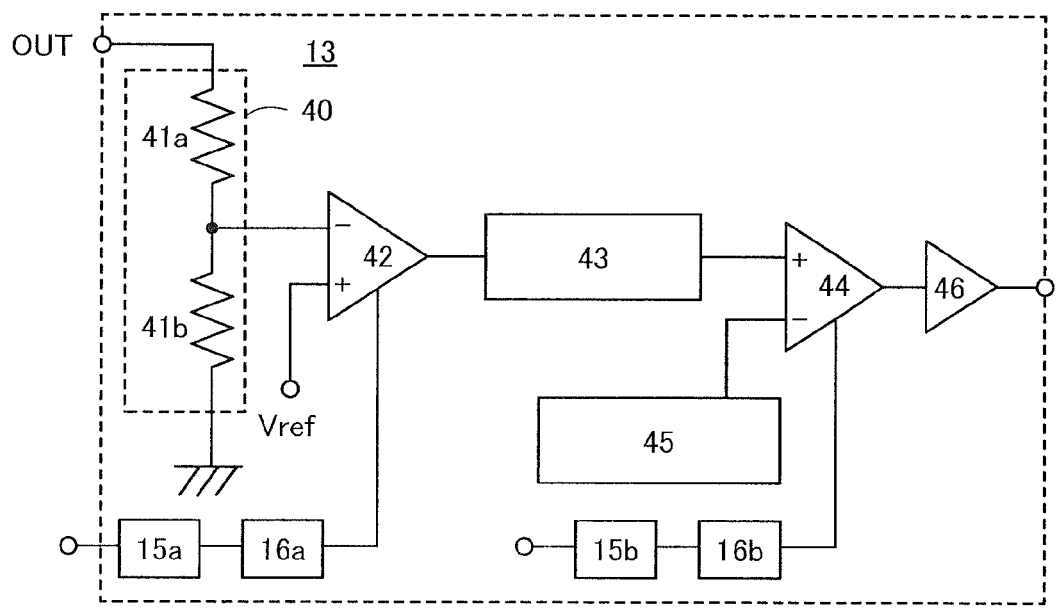
FIG. 4 illustrates a configuration of a control circuit.

FIG. 4 schematically illustrates an example of a configuration of a control circuit. The control circuit 13 illustrated in FIG. 4 includes a voltage divider circuit 40, an error amplifier 42, a phase compensation circuit 43, a comparator 44, a triangle wave oscillator 45, and a buffer 46. The control circuit 13 in FIG. 4 includes a bias circuit 15a having a function of supplying a bias potential to the error amplifier 42 and a holding circuit 16a having a function of holding the bias potential. In addition, the control circuit 13 in FIG. 4 includes a bias circuit 15b having a function of supplying a bias potential to the comparator 44 and a holding circuit 16b having a function of holding the bias potential.

The voltage divider circuit 40 has a function of dividing a difference between the output potential from the output terminal OUT of the DC-DC converter and the reference potential such as a ground potential with resistors. FIG. 4 specifically illustrates the case where the voltage divider circuit 40 includes a resistor 41a and a resistor 41b. The resistor 41a and the resistor 41b are connected in series. The output potential from the output terminal OUT of the DC-DC converter is applied to a first terminal of the resistor 41a, and the reference potential such as a ground potential is applied to a first terminal of the resistor 41b. A second terminal of the resistor 41a and a second terminal of the resistor 41b are connected to an inverting input terminal (−) of the error amplifier 42. The difference between the output potential applied from the output terminal OUT and the reference potential is divided with the resistor 41a and the resistor 41b, and then applied to the inverting input terminal (−) of the error amplifier 42.

A reference voltage Vref is applied to a non-inverting input terminal (+) of the error amplifier 42. In the error amplifier 42, the potential applied to the inverting input terminal (−) and the reference potential Vref are compared and the difference is amplified; then, the amplified difference is output from an output terminal of the error amplifier 42.

Operation of the bias circuit 15a can be stopped in a period during which the bias potential held in the holding circuit 16a is supplied to the comparator 44.

The potential output from the error amplifier 42 is applied to the phase compensation circuit 43. The phase compensation circuit 43 controls a phase of potential output from the error amplifier 42. The phase of the potential is controlled by the phase compensation circuit 43, so that oscillation of an output potential of a variety of circuits using an operational amplifier such as the error amplifier 42 or the comparator 44 is prevented and the operation of the DC-DC converter can be stabilized.

The potential output from the phase compensation circuit 43 is applied to the non-inverting input terminal (+) of the comparator 44. A triangle wave signal or a sawtooth wave signal which is output from the triangle wave oscillator 45 is supplied to the inverting input terminal (−) of the comparator 44. The comparator 44 generates a rectangular wave signal which has a fixed period and has a pulse width changing in accordance with the level of the potential applied to the non-inverting input terminal (+). The rectangular wave signal output from the comparator 44 is output from the control circuit 13 through the buffer 46 and supplied to a gate of the transistor 11 illustrated in FIG. 1A.

Operation of the bias circuit 15b can be stopped in a period during which the bias potential held in the holding circuit 16b is supplied to the comparator 44.

<Configuration Example of Bias Circuit>

Figure 5:
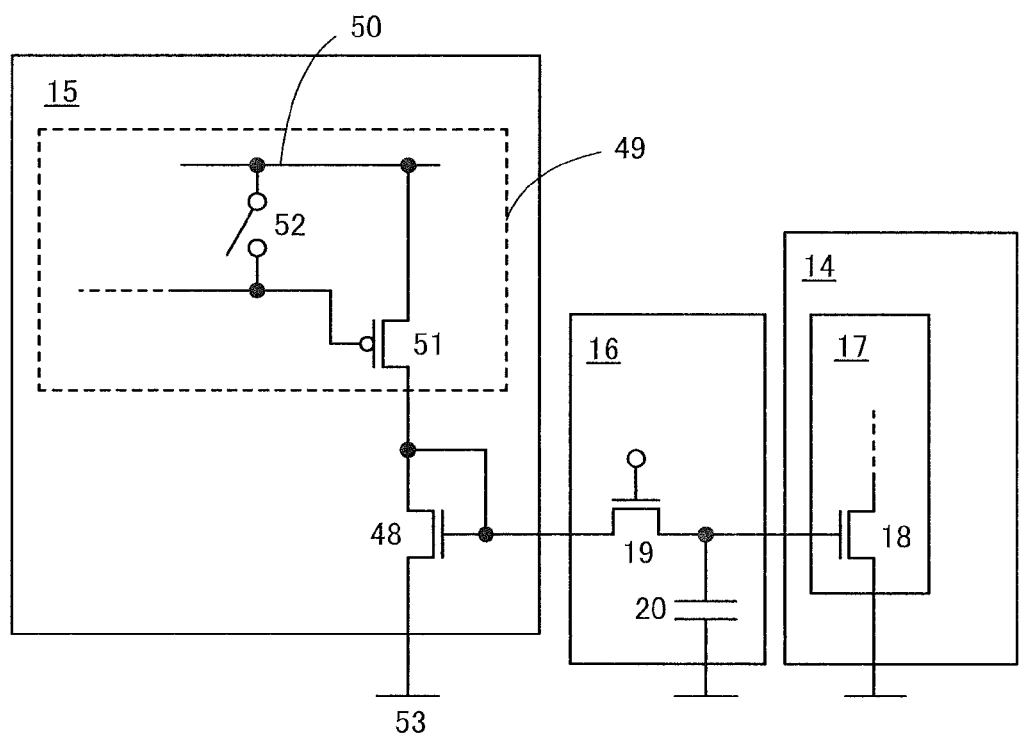
FIG. 5 illustrates configuration examples of a bias circuit, a holding circuit, and an operational amplifier.

FIG. 5 illustrates configuration examples of the bias circuit 15, the holding circuit 16, and the operational amplifier 14. The holding circuit 16 in FIG. 5 has the same configuration as the holding circuit 16 in FIGS. 1A and 1B, and includes the transistor 19 and the capacitor 20. In addition, FIG. 5 illustrates the current source 17 included in the operational amplifier 14. The current source 17 in FIG. 5 has the same configuration as the current source 17 in FIGS. 1A and 1B, and includes the transistor 18.

The bias circuit 15 includes a current source 49 and a transistor 48 in which a gate and a drain are connected to each other. The transistor 48 in which the gate and the drain are connected to each other functions as a variable resistor. The current source 49 has a function of applying a predetermined current between a source and the drain of the transistor 48. The value of the current that flows between the source and the drain of the transistor 48 determines the potential of the gate of the transistor 48. The potential is supplied to the holding circuit 16 as a bias potential.

Specifically, the current source 49 includes a wiring 50, a transistor 51 that controls electrical connection between the current source 49 and the gate of the transistor 48, and a switching element 52 that controls electrical connection between a gate of the transistor 51 and the wiring 50.

Note that FIG. 5 illustrates the case where the transistor 48 is an n-channel transistor and the transistor 51 is a p-channel transistor. Accordingly, the reference potential such as a ground potential is supplied to a wiring 53 electrically connected to the source of the transistor 48, and a potential higher than the reference potential such as a ground potential is supplied to the wiring 50.

When the bias circuit 15 is operated, the switching element 52 is turned off. The gate and a source of the transistor 51 can be electrically isolated from each other when the switching element 52 is off; therefore, the conduction state of the transistor 51 is determined by the potential supplied to the gate. When the operation of the bias circuit 15 is stopped, the switching element 52 is turned on. The gate and the source of the transistor 51 are electrically connected to each other when the switching element 52 is on; accordingly, the transistor 51 is off. Thus, the supply of current from the current source 49 to the transistor 48 is stopped, and the flow of the current between the wiring 50 and the wiring 53 is stopped.

Figure 6:
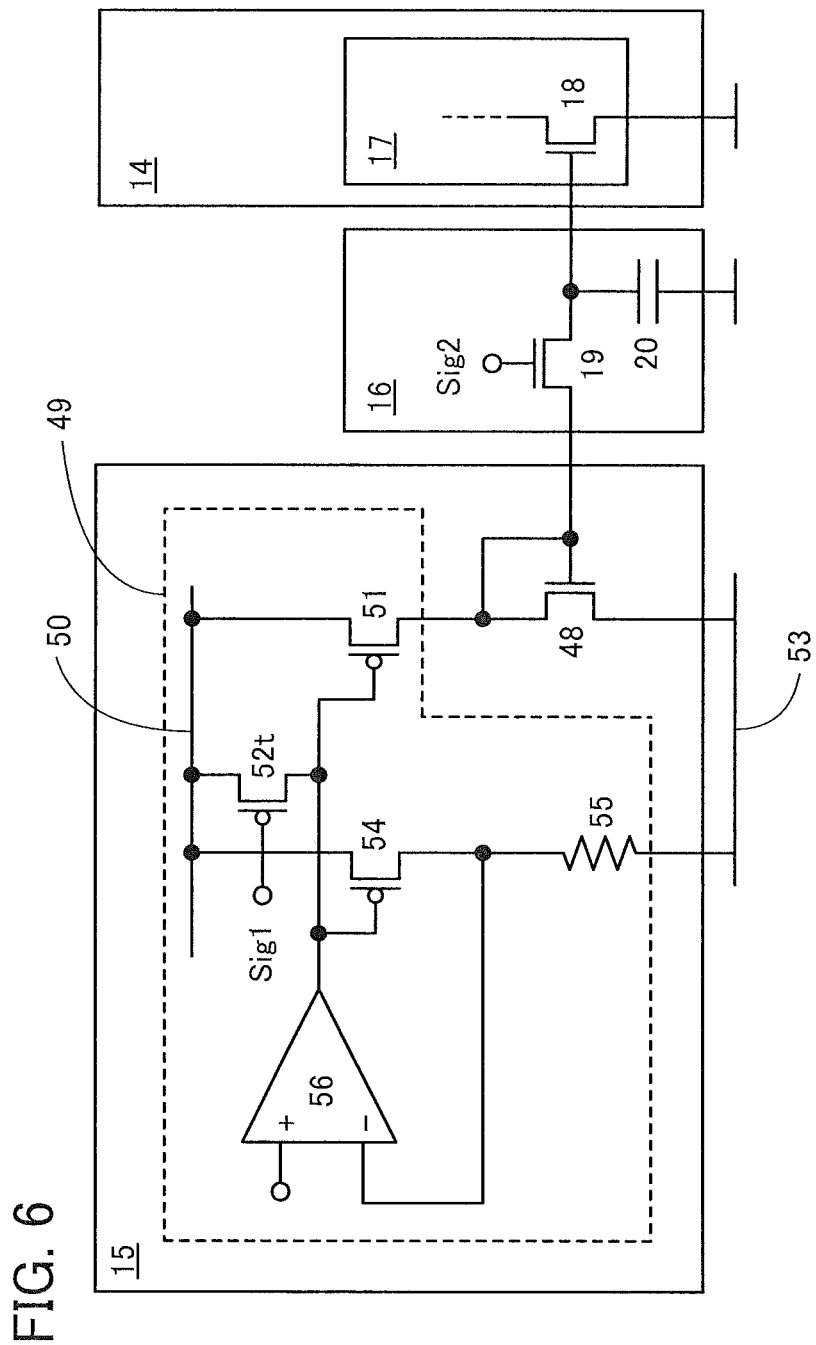
FIG. 6 illustrates configuration examples of a bias circuit, a holding circuit, and an operational amplifier.

FIG. 6 illustrates configuration examples of the bias circuit 15, the holding circuit 16, and the operational amplifier 14. Note that FIG. 6 illustrates the configuration example of the bias circuit 15 more specific than that in FIG. 5.

Like the bias circuit 15 in FIG. 5, the bias circuit 15 in FIG. 6 includes the current source 49 and the transistor 48 in which a gate and a drain are connected to each other. The current source 49 in FIG. 6 includes the transistor 51, a transistor 52t functioning as the switching element 52, a transistor 54, a resistor 55, and an operational amplifier 56. FIG. 6 illustrates the case where the transistor 51, the transistor 52t, and the transistor 54 are all p-channel transistors.

Specifically, one of a source and a drain of the transistor 51 is connected to the wiring 50, the other of the source and the drain of the transistor 51 is connected to the gate of the transistor 48, and the gate of the transistor 51 is connected to an output terminal of the operational amplifier 56. One of a source and a drain of the transistor 52t is connected to the wiring 50, the other of the source and the drain of the transistor 52t is connected to the gate of the transistor 51, and a potential of a signal Sig1 is supplied to a gate of the transistor 52t. One of a source and a drain of the transistor 54 is connected to the wiring 50, the other of the source and the drain of the transistor 54 is connected to a first terminal of the resistor 55, and a gate of the transistor 54 is connected to the output terminal of the operational amplifier 56. A second terminal of the resistor 55 is connected to the wiring 53. A potential from a band gap reference circuit is supplied to a non-inverting input terminal (+) of the operational amplifier 56, and an inverting input terminal (−) of the operational amplifier 56 is connected to the first terminal of the resistor 55.

Figure 7:
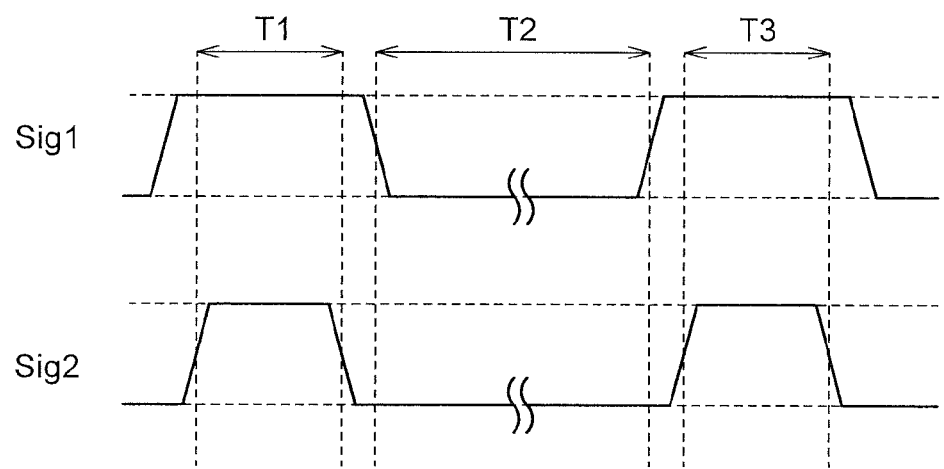
FIG. 7 illustrates a timing chart.

FIG. 7 illustrates an example of a timing chart of the signal Sig1 for controlling switching of the switching element 52 and a signal Sig2 for controlling switching of the transistor 19 included in the holding circuit 16.

As illustrated in FIG. 7, in a period T1, the potential of the signal Sig1 is high. Accordingly, the transistor 52*t* is turned off, and the potential of the output terminal of the operational amplifier 56 is supplied to the gate of the transistor 51. When the transistor 51 is turned on in accordance with the potential, current that flows between the source and the drain of the transistor 51 flows between the source and the drain of the transistor 48. A bias potential is generated at the gate of the transistor 48 in accordance with the value of the current that flows between the source and the drain of the transistor 48.

In addition, in the period T1, the potential of the signal Sig2 is high. Accordingly, the transistor 19 is turned on, and the bias potential is supplied to the capacitor 20 and the gate of the transistor 18 through the transistor 19.

In a period T2, the potential of the signal Sig1 is low. Accordingly, the transistor 52*t* is turned on, and the transistor 51 is turned off because its gate and source are electrically connected to each other. Thus, the flow of the current between the source and the drain of the transistor 48 is stopped.

In addition, in the period T2, the potential of the signal Sig2 is low. Accordingly, the transistor 19 is turned off, and the bias potential is held in the capacitor 20. The bias potential held in the capacitor 20 is supplied to the gate of the transistor 18.

<Configuration Example of Error Amplifier Circuit>

Figure 8:
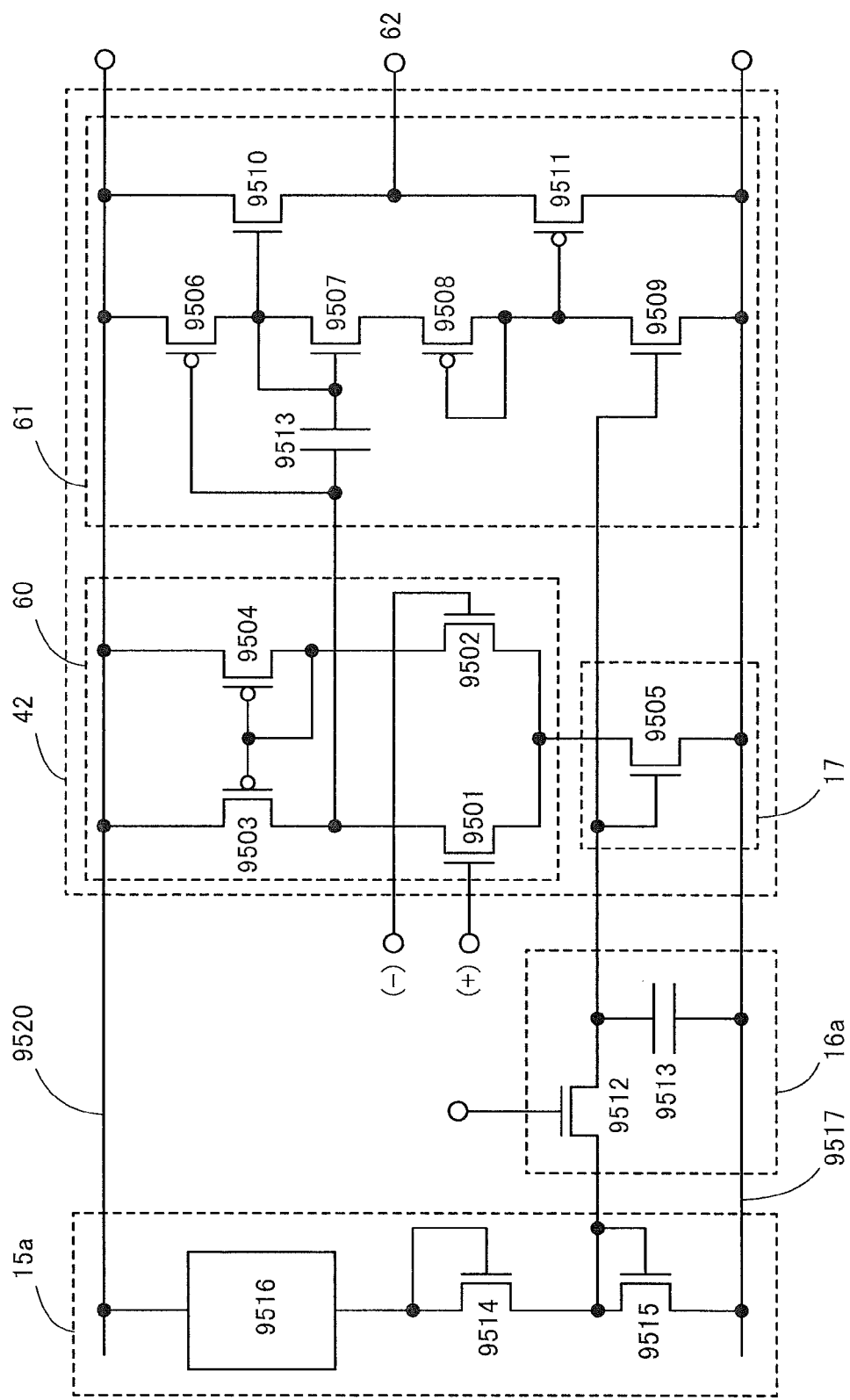
FIG. 8 illustrates configuration examples of a bias circuit, a holding circuit, and an error amplifier circuit.

FIG. 8 illustrates configuration examples of the bias circuit 15*a*, the holding circuit 16*a*, and the error amplifier 42.

The bias circuit 15*a* in FIG. 8 includes a current source 9516, an n-channel transistor 9514 in which a gate and a drain are connected to each other, and an n-channel transistor 9515 in which a gate and a drain are connected to each other. The current source 9516 has a function of controlling the flow of current between a wiring 9520 to which a high-level potential is supplied and the drain of the transistor 9514. The gate and the drain of the transistor 9515 are connected to a source of the transistor 9514. A source of the transistor 9515 is connected to a wiring 9517 to which a low-level potential is supplied.

The holding circuit 16*a* includes an n-channel transistor 9512 and a capacitor 9513. One of a source and a drain of the transistor 9512 is connected to the gate of the transistor 9515, and the other of the source and the drain of the transistor 9512 is connected to the capacitor 9513.

The error amplifier 42 includes a differential amplifier 60, the current source 17, and an output circuit 61. The differential amplifier 60 has a function of amplifying a potential difference between a non-inverting input terminal (+) and an inverting input terminal (−). The current source 17 has a function of supplying a predetermined current to the differential amplifier 60 in accordance with a bias potential from the holding circuit 16*a*. The output circuit 61 has a function of amplifying and outputting the potential difference amplified in the differential amplifier 60.

Specifically, the differential amplifier 60 includes an n-channel transistor 9501, an n-channel transistor 9502, a p-channel transistor 9503, and a p-channel transistor 9504. The current source 17 includes an n-channel transistor 9505.

One of a source and a drain of each of the transistors 9503 and 9504 is connected to the wiring 9520. Gates of the transistor 9503 and the transistor 9504 are connected to each other. The other of the source and the drain of the transistor 9504 is connected to the gate of the transistor 9504. A gate of the transistor 9505 is connected to the other of the source and the drain of the transistor 9512. One of a source and a drain of the transistor 9505 is connected to the wiring 9517, and the other of the source and the drain of the transistor 9505 is connected to one of a source and a drain of each of the transistors 9501 and 9502. A gate of the transistor 9501 functions as the non-inverting input terminal (+) of the differential amplifier 60, and a gate of the transistor 9502 functions as an inverting input terminal (−) of the differential amplifier 60. The other of the source and the drain of the transistor 9503 is connected to the other of the source and the drain of the transistor 9501. The other of the source and the drain of the transistor 9504 is connected to the other of the source and the drain of the transistor 9502.

The output circuit 61 includes a p-channel transistor 9506, an n-channel transistor 9507, a p-channel transistor 9508, an n-channel transistor 9509, an n-channel transistor 9510, a p-channel transistor 9511, and the capacitor 9513. The potential of the other of the source and the drain of the transistor 9501 is amplified in the output circuit 61 and supplied to an output terminal 62.

<Example of Cross-Sectional Structure of DC-DC Converter>

Figure 9:
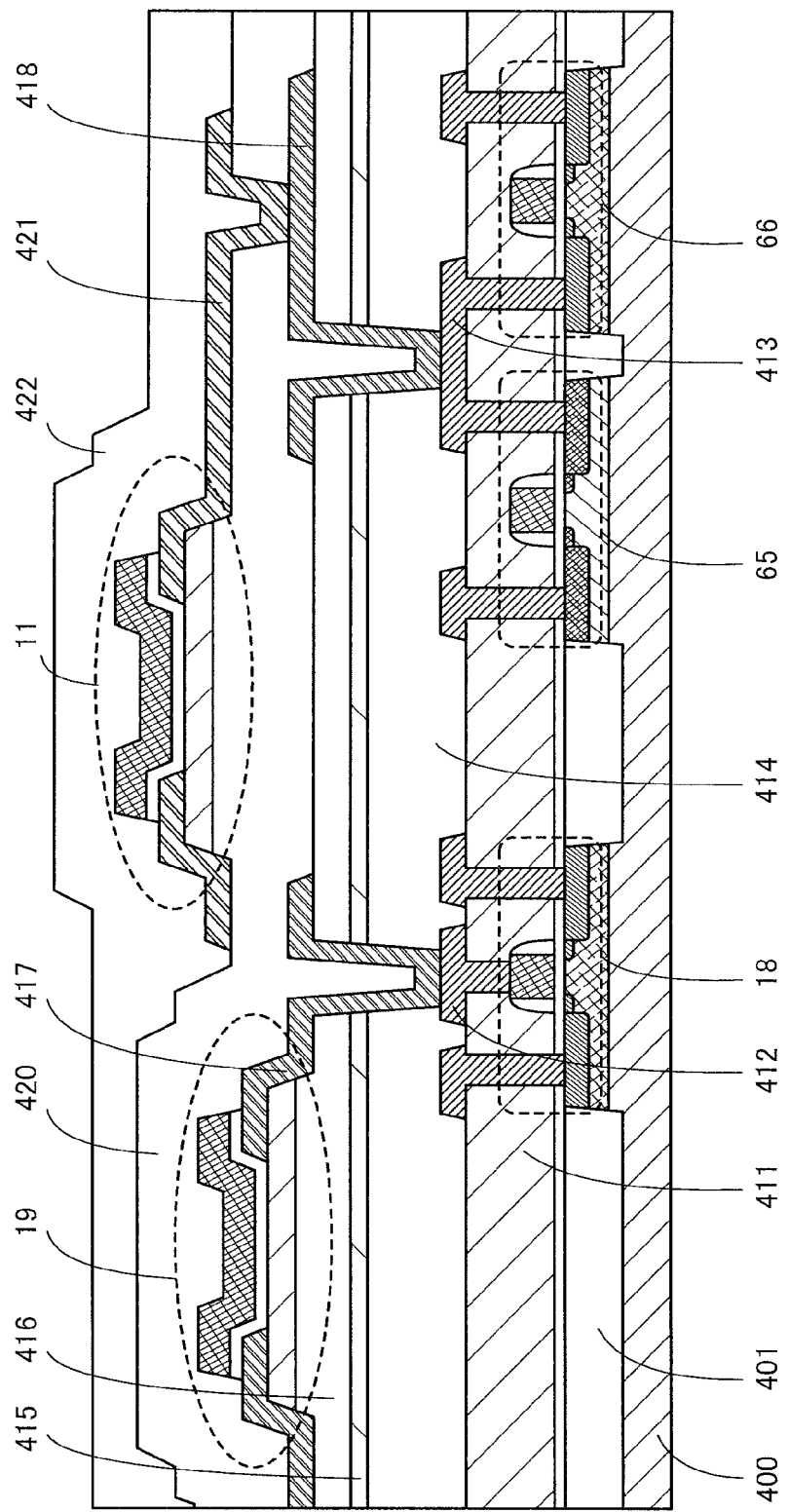
FIG. 9 illustrates an example of a cross-sectional structure of a DC-DC converter.

In FIG. 9, an example of a cross-sectional structure of a DC-DC converter is illustrated. FIG. 9 illustrates examples of cross-sectional structures of the transistor 11, the transistor 18, and the transistor 19 which are illustrated in FIGS. 1A and 1B and a transistor 65 and a transistor 66 which are included in the buffer 46 in FIG. 4.

Note that FIG. 9 illustrates the case where the transistor 11 and the transistor 19 each including a channel formation region in an oxide semiconductor film are formed over the n-channel transistor 18, the p-channel transistor 65, and the n-channel transistor 66 each including a channel formation region in a single crystal silicon substrate.

The transistor 18, the transistor 65, and the transistor 66 may each include the channel formation region in a semiconductor film or a semiconductor substrate of silicon, germanium, or the like in an amorphous, microcrystalline, polycrystalline, or single crystal state. Alternatively, the transistor 18, the transistor 65, and the transistor 66 may each include the channel formation region in an oxide semiconductor film or an oxide semiconductor substrate. When the transistors each include the channel formation region in an oxide semiconductor film or an oxide semiconductor substrate, the transistor 11 and the transistor 19 do not need to be stacked over the transistor 18, the transistor 65, and the transistor 66, and all of the transistors may be formed in one layer.

In the case where the transistor 18, the transistor 65, and the transistor 66 are formed using a thin silicon film, the thin film can be, for example, an amorphous silicon film formed by a sputtering method or a vapor phase deposition method such as a plasma CVD method, a polycrystalline silicon film obtained by crystallization of an amorphous silicon film by laser annealing or the like, or a single crystal silicon film formed by separation of a surface portion of a single crystal silicon wafer by implantation of hydrogen ions or the like into the silicon wafer.

A semiconductor substrate 400 where the transistor 18, the transistor 65, and the transistor 66 are formed can be, for example, a silicon substrate, a germanium substrate, or a silicon germanium substrate. FIG. 9 illustrates an example of using a single crystal silicon substrate as the semiconductor substrate 400.

The transistor 18, the transistor 65, and the transistor 66 are electrically isolated from each other by an element isolation method. As the element isolation method, a local oxidation of silicon (LOCOS) method, a shallow trench isolation (STI) method, or the like can be employed. In FIG. 9, the transistor 18, the transistor 65, and the transistor 66 are electrically isolated from each other by the STI method. Specifically, in FIG. 9, to electrically isolate the transistor 18, the transistor 65, and the transistor 66 from each other, after trenches are formed in the semiconductor substrate 400 by etching or the like, element separation regions 401 are formed by embedding an insulating material such as silicon oxide in the trenches.

An insulating film 411 is provided on the transistor 18, the transistor 65, and the transistor 66. Openings are formed in the insulating film 411. Over the insulating film 411 and in the openings, a plurality of conductive films connected to sources, drains, and gates of the transistor 18, the transistor 65, and the transistor 66 are provided. A conductive film 412 of the plurality of conductive films is connected to the gate of the transistor 18. A conductive film 413 of the plurality of conductive films is connected to one of the source and the drain of the transistor 65 and one of the source and the drain of the transistor 66.

An insulating film 414 is provided over the insulating film 411, the conductive film 412, and the conductive film 413. An insulating film 415 having an effect of blocking diffusion of oxygen, hydrogen, and water is provided over the insulating film 414. As the insulating film 415 has higher density and becomes denser or has a fewer dangling bonds and becomes more chemically stable, the insulating film 415 has a higher blocking effect. The insulating film 415 that has the effect of blocking diffusion of oxygen, hydrogen, and water can be formed using a film formed of aluminum oxide, aluminum oxynitride, gallium oxide, gallium oxynitride, yttrium oxide, yttrium oxynitride, hafnium oxide, hafnium oxynitride, or the like. The insulating film 415 having an effect of blocking diffusion of hydrogen and water can be formed using a film formed of silicon nitride, silicon nitride oxide, or the like.

An insulating film 416 is formed over the insulating film 415. The transistor 19 is provided over the insulating film 416. Openings are provided in the insulating films 414 to 416, and a conductive film 417 functioning as a source or a drain of the transistor 19 is connected to the conductive film 412 in the opening. In addition, a conductive film 418 connected to the conductive film 413 in the opening is provided over the insulating film 416.

An insulating film 420 is provided over the transistor 19 and the conductive film 418. The transistor 11 is provided over the insulating film 420. Openings are provided in the insulating film 420, and a conductive film 421 functioning as a source or a drain of the transistor 11 is connected to the conductive film 418 in the opening. In addition, an insulating film 422 is provided over the transistor 11.

<Oxide Semiconductor Film>

An oxide semiconductor film is classified roughly into a single-crystal oxide semiconductor film and a non-single-crystal oxide semiconductor film The non-single-crystal oxide semiconductor film includes any of an amorphous oxide semiconductor film, a microcrystalline oxide semiconductor film, a polycrystalline oxide semiconductor film, a CAAC-OS film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

<CAAC-OS Film>

The CAAC-OS film is an oxide semiconductor film including a plurality of c-axis aligned crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. However, in the high-resolution TEM image, a boundary between crystal parts, that is, a grain boundary is not clearly found. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In a high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film including an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has a higher strength of bonding to oxygen than that of a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor using the oxide semiconductor film rarely has negative threshold voltage (is rarely normally on). The highly purified intrinsic or substantially highly purified intrinsic oxide semiconductor film has few carrier traps. Accordingly, the transistor using the oxide semiconductor film has little change in electrical characteristics and high reliability. Electrical charges trapped by the carrier traps in the oxide semiconductor film take a long time to be released, and might behave like fixed electrical charges. Thus, the transistor that uses the oxide semiconductor film having high impurity concentration and a high density of defect states has unstable electrical characteristics in some cases.

With the use of the CAAC-OS film in a transistor, a change in the electrical characteristics of the transistor due to irradiation with visible light or ultraviolet light is small.

<Microcrystalline Oxide Semiconductor Film>

A microcrystalline oxide semiconductor film has a region where a crystal part can be found in the high-resolution TEM image and a region where a crystal part cannot be found clearly in the high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are observed in a nanobeam electron diffraction pattern of the nc-OS film that is obtained by using an electron beam having a probe diameter close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are observed in a ring-like region in some cases.

The nc-OS film is an oxide semiconductor film having more regularity than an amorphous oxide semiconductor film; thus, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

<Amorphous Oxide Semiconductor Film>

The amorphous oxide semiconductor film has disordered atomic arrangement and no crystal part. For example, the amorphous oxide semiconductor film does not have a specific state like quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

Furthermore, the film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition as the oxide semiconductor film. For example, the film density of the a-like OS film is 78.6% or higher and lower than 92.3% of the film density of the single crystal oxide semiconductor film having the same composition. For example, the film density of the nc-OS film and the CAAC-OS film is 92.3% or higher and lower than 100% of the film density of the single crystal oxide semiconductor film having the same composition. Note that it is difficult to form an oxide semiconductor film having a film density of lower than 78% of the film density of the single crystal oxide semiconductor film having the same composition.

Specific examples of the above description are given. For example, in an oxide semiconductor film in which the atomic ratio of In to Ga and Zn is 1:1:1, the film density of a single crystal of InGaZnO$_4$ with a rhombohedral crystal structure is 6.357 g/cm$^3$. Accordingly, in the oxide semiconductor film in which the atomic ratio of In to Ga and Zn is 1:1:1, the film density of the a-like OS film is higher than or equal to 5.0 g/cm$^3$ and lower than 5.9 g/cm$^3$, and the film density of the nc-OS film and the CAAC-OS film is higher than or equal to 5.9 g/cm$^3$ and lower than 6.3 g/cm$^3$.

However, there might be no single crystal oxide semiconductor film having the same composition as the oxide semiconductor film. In that case, single crystal oxide semiconductor films with different compositions are combined in an adequate ratio to calculate film density equivalent to that of a single crystal oxide semiconductor film with the desired composition. The film density of the single crystal oxide semiconductor film with the desired composition may be obtained by calculating the weighted average of the film densities of the single crystal oxide semiconductor films with the different compositions in consideration of the combination ratio therebetween. Note that it is preferable to use as few kinds of single crystal oxide semiconductor film as possible to calculate the film density.

Note that an oxide semiconductor film may be a stacked film including two or more films of an amorphous oxide semiconductor film, an a-like OS film, a microcrystalline oxide semiconductor film, and a CAAC-OS film, for example.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. The concentration of impurities in a deposition gas may also be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Furthermore, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on a target to be formed.

An alkali metal is not a constituent element of an oxide semiconductor and thus is an impurity. Also, alkaline earth metal is an impurity in the case where the alkaline earth metal is not a constituent element of the oxide semiconductor. Alkali metal, in particular, Na becomes Na$^+$ when an insulating film in contact with the oxide semiconductor film is an oxide and Na diffuses into the insulating film. In addition, in the oxide semiconductor film, Na cuts or enters a bond between metal and oxygen which are included in the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably $5\times10^{16}$/cm$^3$ or lower, more preferably $1\times10^{16}$/cm$^3$ or lower, still more preferably $1\times10^{15}$/cm$^3$ or lower. Similarly, the measured Li concentration is preferably $5\times10^{15}$/cm$^3$ or lower, more preferably $1\times10^{15}$/cm$^3$ or lower. Similarly, the measured K concentration is preferably $5\times10^{15}$/cm$^3$ or lower, more preferably $1\times10^{15}$/cm$^3$ or lower.

In the case where a metal oxide containing indium is used, silicon or carbon having higher bond energy with oxygen than that of indium might cut the bond between indium and oxygen, so that an oxygen vacancy is formed. Accordingly, when silicon or carbon is contained in the oxide semiconductor film, the electrical characteristics of the transistor are likely to deteriorate as in the case of using an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1\times10^{18}/cm^3$. In this case, the deterioration of the electrical characteristics of the transistor can be prevented, so that the reliability of a semiconductor device can be improved.

<Method for Manufacturing Transistor>

Next, an example of a method for manufacturing the transistor 30 is described with reference to FIGS. 10A to 10D.

Figure 10A:
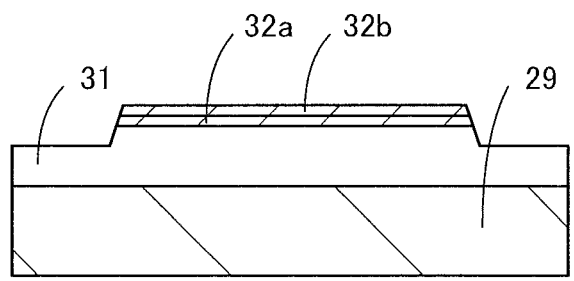
FIGS. 10A to 10D are cross-sectional views illustrating one mode of a method for manufacturing a semiconductor device.

Two oxide semiconductor films are stacked over the insulating film 31 formed on the substrate 29 in a certain order, and then selectively etched; thus, the oxide semiconductor film 32a and the oxide semiconductor film 32b which are stacked in this order and have island shapes are formed (see FIG. 10A).

The insulating film 31 has a function of preventing impurities contained in a layer under the insulating film 31 from entering the oxide semiconductor film 32a, the oxide semiconductor film 32b, and the oxide semiconductor film 32c formed in a later step. In addition, the insulating film 31 has a function of supplying oxygen to the oxide semiconductor films 32a, 32b, and 32c. For this reason, the insulating film 31 is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 31 can be formed by a sputtering method, a CVD method, an MBE method, an ALD method, a PLD method, or the like.

Oxygen may be added to the insulating film 31 by an ion implantation method, an ion doping method, a plasma immersion ion implantation method, or the like. Implantation of oxygen allows the insulating film 31 to contain oxygen with a higher proportion than a proportion of oxygen in the stoichiometric composition.

The insulating film 31 may be over-etched at the time of selectively etching the two oxide semiconductor films to form the oxide semiconductor film 32a and the oxide semiconductor film 32b. When the insulating film 31 is over-etched, the thickness of the insulating film 31 in a region where the oxide semiconductor film 32a and the oxide semiconductor film 32b are formed can be larger than that of the insulating film 31 in the other region. With the above structure, the transistor 30 with an s-channel structure can be formed.

When the oxide semiconductor films forming the oxide semiconductor films 32a and 32b each contain a large amount of hydrogen, the hydrogen and the oxide semiconductor are bonded to each other, so that part of the hydrogen serves as a donor and causes generation of an electron which is a carrier. By the generation of an electron, the threshold voltage of the transistor shifts in the negative direction. Therefore, first heat treatment is preferably performed in a period after the two oxide semiconductor films are formed over the insulating film 31 and before the oxide semiconductor films 32a and 32b are formed by etching. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. By the first heat treatment, hydrogen or moisture can be removed from the oxide semiconductor films 32a and 32b, and oxygen contained in the insulating film 31 can be supplied to the oxide semiconductor film to fill oxygen vacancies. The first heat treatment can increase the crystallinity in the oxide semiconductor films 32a and 32b. Alternatively, the first heat treatment may be performed in such a manner that heat treatment is performed in an inert gas atmosphere, and then another heat treatment is performed in an atmosphere containing an oxidizing gas at 10 ppm or more. In the above manner, the amount of oxygen supplied to the oxide semiconductor films 32a and 32b can be increased, and the number of oxygen vacancies can be further reduced.

Note that the first heat treatment may be performed after the oxide semiconductor films 32a and 32b are formed by etching.

There are few carrier generation sources in a highly purified oxide semiconductor (purified oxide semiconductor) obtained by reduction of impurities such as moisture or hydrogen serving as electron donors (donors) and reduction of oxygen vacancies; therefore, the highly purified oxide semiconductor can be an intrinsic (i-type) semiconductor or a substantially i-type semiconductor. For this reason, a transistor including a channel formation region in a highly purified oxide semiconductor film has extremely low off-state current and high reliability. A transistor including a channel formation region in the oxide semiconductor film is likely to have positive threshold voltage (also referred to as normally-off characteristics). Accordingly, the oxide semiconductor films 32a and 32b which are highly purified by removal of hydrogen or moisture and filling of oxygen vacancies are i-type (intrinsic) or substantially i-type oxide semiconductor films. For this reason, the transistor 30 including a channel formation region in the highly purified oxide semiconductor films 32a and 32b has extremely low off-state current and high reliability.

Specifically, various experiments can prove low off-state current of a transistor including a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between a source electrode and a drain electrode of from 1 V to 10 V. In this case, it can be seen that off-state current standardized on the channel width of the transistor is lower than or equal to 100 zA/μm. In addition, a capacitor and a transistor are connected to each other, and the off-state current is measured with a circuit in which electrical charges flowing into or from the capacitor are controlled by the transistor. In the measurement, a highly purified oxide semiconductor film is used for a channel formation region of the transistor, and the off-state current of the transistor is measured from a change in the amount of electrical charge in the capacitor per unit time. As a result, it is found that when the voltage between source and drain electrodes of the transistor is 3 V, a lower off-state current of several tens of yoctoamperes per micrometer (yA/μm) is obtained. Consequently, the transistor in which a highly purified oxide semiconductor film is used for a channel formation region has much lower off-state current than a transistor using crystalline silicon.

Figure 10B:
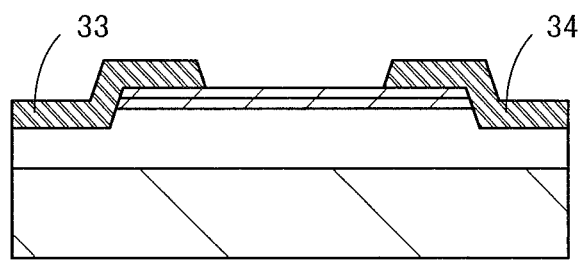

Next, a conductive film is formed over the oxide semiconductor films 32a and 32b and then processed into a desired shape by etching or the like to form the conductive film 33 and the conductive film 34 which function as a source electrode and a drain electrode (see FIG. 10B). As the conductive film 33 and the conductive film 34, a conductive film containing a metal material such as molybdenum, titanium, chromium, tantalum, tungsten, aluminum, copper, neodymium, scandium, or niobium, or an alloy material containing any of these metal materials as a main component can be used.

Figure 10C:
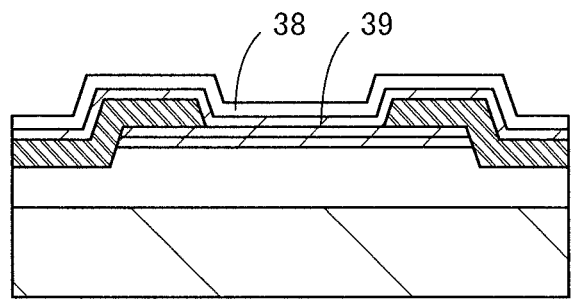
Figure 10D:
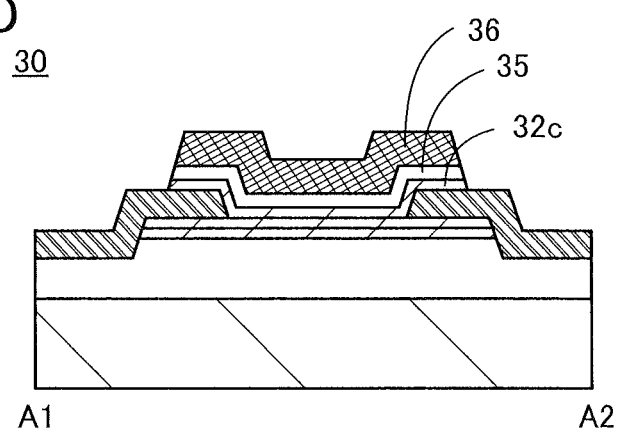

An oxide semiconductor film 39 which is to serve as the oxide semiconductor film 32c is formed over the oxide semiconductor film 32b, the conductive film 33, and the conductive film 34, and then an insulating film 38 which is to serve as the insulating film 35 is formed over the oxide semiconductor film 39 (see FIG. 10C). After the oxide semiconductor film 39 is formed, second heat treatment may be performed in a condition similar to that of the first heat treatment to remove hydrogen or moisture in the oxide semiconductor film 39.

An oxide semiconductor that can be used for each of the oxide semiconductor films 32a, 32b, and 32c preferably contains at least indium (In) or zinc (Zn). Furthermore, as a stabilizer for reducing variations in electrical characteristics of the transistors 30, the oxide semiconductor preferably contains gallium (Ga) in addition to indium (In) and/or zinc (Zn). Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

An In—Ga—Zn oxide and an In—Sn—Zn oxide among oxide semiconductors have the following advantages over silicon carbide, gallium nitride, and gallium oxide: transistors with excellent electrical characteristics can be formed by a sputtering method or a wet process and thus can be mass-produced easily. Moreover, unlike in the case of using silicon carbide, gallium nitride, or gallium oxide, with the use of the In—Ga—Zn oxide, transistors with excellent electrical characteristics can be formed over a glass substrate, and a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio between In, Ga, and Zn. Furthermore, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily with an In—Sn—Zn oxide. Meanwhile, when an In—Ga—Zn oxide is used, the mobility can be increased by reduction in the defect density in a bulk.

For example, when an In—Ga—Zn oxide film formed by a sputtering method is used as each of the oxide semiconductor films 32a and 32c, the oxide semiconductor films 32a and 32c can be deposited with the use of an In—Ga—Zn oxide target containing In, Ga, and Zn in an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 32b is a CAAC-OS film, the oxide semiconductor film 32b is preferably deposited with the use of a polycrystalline In—Ga—Zn oxide containing In, Ga, and Zn in an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

The insulating film 38 may be a single layer or a stacked layer of an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

For example, when the insulating film 38 has a two-layer structure, a silicon nitride film and a silicon oxide film may be used as the first layer and the second layer, respectively. A silicon oxynitride film can be used as the second layer instead of the silicon oxide film. A silicon nitride oxide film can be used as the first layer instead of the silicon nitride film.

A silicon oxide film with a low defect density is preferably used as the silicon oxide film. Specifically, a silicon oxide film whose spin density attributed to a signal with a g factor of 2.001 in ESR spectroscopy is less than or equal to $3 \times 10^{17}$ spins/cm$^3$, preferably less than or equal to $5 \times 10^{16}$ spins/cm$^3$ is used. As the silicon oxide film, a silicon oxide film having excess oxygen is preferably used. As the silicon nitride film, a silicon nitride film from which hydrogen and ammonia are less released is used. The amount of released hydrogen and ammonia may be measured by thermal desorption spectroscopy (TDS) analysis.

When a specific material is used for the insulating film 38 to trap electrons in the insulating film 38, the threshold voltage of the transistor 30 can be shifted in the positive direction. For example, a material having a lot of electron trap states, such as hafnium oxide, aluminum oxide, or tantalum oxide, is used for part of the insulating film 38 (e.g., a stacked-layer film of silicon oxide and hafnium oxide is used as the insulating film 38) and the state where the potential of the conductive film 36 formed in a later step is higher than those of the conductive films 33 and 34 is kept for one second or more, typically one minute or more at a higher temperature (a temperature higher than the operating temperature or the storage temperature of a semiconductor device or a DC-DC converter, or a temperature of 125° C.

or higher and 450° C. or lower, typically a temperature of 150° C. or higher and 300° C. or lower). Thus, some of electrons which have moved from the oxide semiconductor films 32a, 32b, and 32c to the conductive film 36 are trapped by the electron trap states.

In the transistor 30 in which a necessary amount of electron is trapped by the electron trap states in this manner, the threshold voltage is shifted in the positive direction. The amount of electron trapped in the insulating film 38 can be adjusted by the value of the potential of the conductive film 36; thus, the amount of shift of the threshold voltage can be adjusted. Treatment for trapping electrons in the insulating film 38 can be performed in the manufacturing process of the transistor 30.

For example, the treatment can be performed at any step before factory shipment, such as after the formation of a wiring connected to the conductive film 33 and the conductive film 34 of the transistor 30, after the preceding process (wafer processing), after a wafer-dicing step, after packaging, or the like. In any case, it is preferable that the transistor 30 be not exposed to a temperature higher than or equal to 125° C. for one hour or more after the treatment.

Next, a conductive film is formed over the insulating film 38 by a sputtering method or the like, and then the conductive film, the insulating film 38, and the oxide semiconductor film 39 are processed to have desired shapes by etching or the like; thus, the conductive film 36, the island-shaped insulating film 35, and the island-shaped oxide semiconductor film 32c are formed. Aluminum, titanium, chromium, cobalt, nickel, copper, yttrium, zirconium, molybdenum, ruthenium, silver, tantalum, and tungsten, or an alloy material containing any of these as its main component can be used for the conductive film 36.

Through the above-described steps, the transistor 30 illustrated in FIGS. 10A to 10D can be manufactured.

After the transistor 30 is manufactured, an insulating film is preferably formed over the insulating film 35 and the conductive film 36. For the insulating film, a material in which little oxygen is diffused or transferred may be used. In addition, a material containing less hydrogen may be used for the insulating film. The hydrogen content of the insulating film is preferably less than $5 \times 10^{19}$ cm$^{-3}$, more preferably less than $5 \times 10^{18}$ cm$^{-3}$. When the hydrogen content of the insulating film is set to the above value, the off-state current of the transistor 30 can be low.

As the insulating film, a silicon nitride film or a silicon nitride oxide film may be used, for example. The insulating film can be formed by a sputtering method, a CVD method, an MBE method, an ALD method, or a PLD method. In particular, for the insulating film, a silicon nitride film is preferably formed by a sputtering method, in which case the content of water or hydrogen is low.

<Configuration Example 2 of DC-DC Converter>

The DC-DC converter of one embodiment of the present invention may be a step-up DC-DC converter which outputs a potential higher than an input potential or a step-down DC-DC converter which outputs a potential lower than the input potential.

Figure 11A:
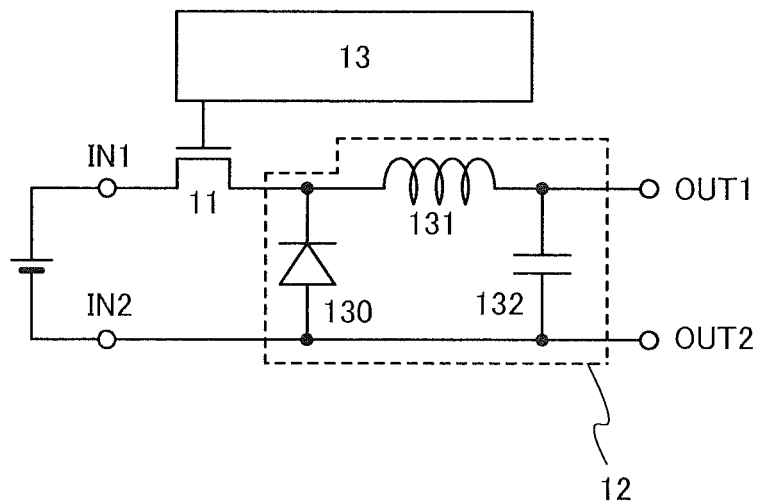
FIGS. 11A and 11B illustrate configuration examples of a DC-DC converter.

FIG. 11A illustrates a configuration example of the step-down DC-DC converter 10 which is one embodiment of the present invention. In the DC-DC converter 10 illustrated in FIG. 11A, the smoothing circuit 12 includes a diode 130, a coil 131, and a capacitor 132. In addition, the DC-DC converter 10 in FIG. 11A includes an input terminal IN1 to which an input potential is applied, an input terminal IN2 to which a reference potential is applied, an output terminal OUT1, and an output terminal OUT2.

The transistor 11 controls connection between the input terminal IN1 and a cathode of the diode 130. Specifically, one of a source and a drain of the transistor 11 is connected to the input terminal IN1 and the other of the source and the drain of the transistor 11 is connected to the cathode of the diode 130. One of a pair of terminals of the coil 131 is connected to the cathode of the diode 130 and the other of the pair of terminals of the coil 131 is connected to the output terminal OUT1 of the DC-DC converter 10. The input terminal IN2 is connected to an anode of the diode 130 and the output terminal OUT2. One of a pair of electrodes the capacitor 132 is connected to the output terminal OUT1 and the other of the pair of electrodes the capacitor 132 is connected to the output terminal OUT2.

In the DC-DC converter 10 in FIG. 11A, when the transistor 11 is turned on, voltage is generated between the input terminal IN1 and the output terminal OUT1; thus, current flows through the coil 131. In the coil 131, electromotive force in a direction opposite to that of the current flow is generated by self-induction. Thus, a potential which is obtained by a decrease in the input potential applied to the input terminal IN1 is applied to the output terminal OUT1. In other words, between the pair of electrodes of the capacitor 132, voltage equivalent to a difference between a reference potential applied from the input terminal IN2 and the potential obtained by a decrease in the input potential is applied.

Then, when the transistor 11 is turned off, a current path formed between the input terminal IN1 and the output terminal OUT1 is blocked. In the coil 131, electromotive force in a direction in which the change of the current is prevented, that is, a direction opposite to that of the electromotive force generated when the transistor 11 is on is generated. Thus, the current that flows into the coil 131 is kept by voltage generated by the electromotive force. In other words, when the transistor 11 is off, a current path is formed between the input terminal IN2 and the output terminal OUT1 or between the output terminal OUT2 and the output terminal OUT1 through the coil 131 and the diode 130. Accordingly, voltage applied between the pair of electrodes of the capacitor 132 is held to some extent.

Note that the potential of the one electrode of the capacitor 132 is equivalent to the potential output from the output terminal OUT1. In the above operation, as the percentage of a period during which the transistor 11 is on is increased, the level of voltage held in the capacitor 132 becomes closer to that of a difference between the reference potential and the input potential. Accordingly, the voltage can be decreased so that the output potential whose level is closer to that of the input potential is obtained. In contrast, as the percentage of a period during which the transistor 11 is off is increased, a difference between the reference potential and the potential of the one electrode of the capacitor 132 becomes smaller. Accordingly, the voltage can be decreased so that the output potential whose level is closer to that of the reference potential is obtained.

Figure 11B:
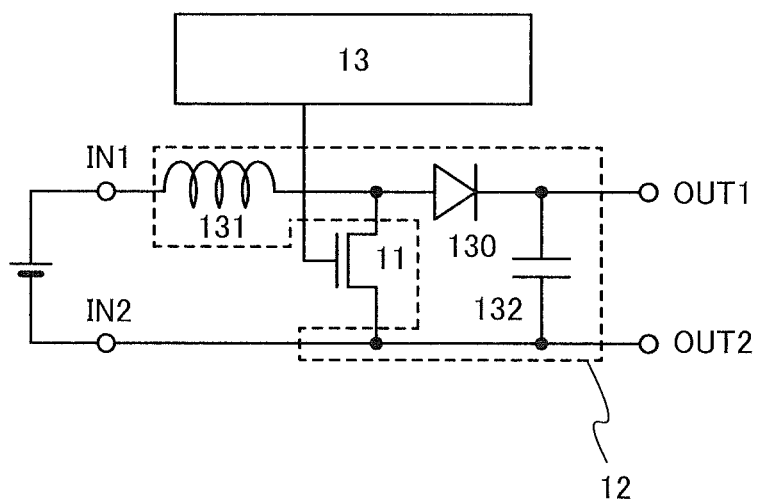

Next, FIG. 11B illustrates a configuration example of the step-up DC-DC converter 10 of one embodiment of the present invention.

In the DC-DC converter 10 illustrated in FIG. 11B, the smoothing circuit 12 includes the diode 130, the coil 131, and the capacitor 132. In addition, the DC-DC converter 10 in FIG. 11B includes the input terminal IN1 to which an input potential is applied, the input terminal IN2 to which a reference potential is applied, the output terminal OUT1, and the output terminal OUT2.

One of a pair of terminals of the coil 131 is connected to the input terminal IN1, and the other of the pair of terminals of the coil 131 is connected to an anode of the diode 130. The transistor 11 controls connection between the input terminal IN2 and a node between the coil 131 and the diode 130 or between the output terminal OUT2 and the node. Specifically, one of a source and a drain of the transistor 11 is connected to the node between the coil 131 and the diode 130, and the other of the source and the drain of the transistor 11 is connected to the input terminal IN2 and the output terminal OUT2. A cathode of the diode 130 is connected to the output terminal OUT1. One of a pair of electrodes of the capacitor 132 is connected to the output terminal OUT1 and the other of the pair of electrodes of the capacitor 132 is connected to the output terminal OUT2.

In the DC-DC converter 10 illustrated in FIG. 11B, when the transistor 11 is turned on, voltage is generated between the input terminal IN1 and the input terminal IN2; thus, current flows through the coil 131. In the coil 131, electromotive force in a direction opposite to that of the current flow is generated by self-induction, so that the current is gradually increased.

Next, when the transistor 11 is turned off, a current path formed between the input terminal IN1 and the input terminal IN2 is blocked. In the coil 131, electromotive force in a direction in which the change of the current is prevented, that is, a direction opposite to that of the electromotive force generated when the transistor 11 is on is generated. Thus, voltage corresponding to the current flowing through the coil 131 when the transistor 11 is on is generated between the pair of terminals of the coil 131. Then, the current flowing through the coil 131 is held by the voltage generated between the terminals. In other words, when the transistor 11 is off, a current path is formed between the input terminal IN1 and the output terminal OUT1 through the coil 131 and the diode 130. At this time, a potential which is the sum of the input potential applied to the input terminal IN1 and the voltage generated between the terminals of the coil 131 is applied to the output terminal OUT1, and is output from the DC-DC converter 10 as an output potential. Voltage equivalent to a difference between the potential of the output terminal OUT1 and the reference potential is held between the electrodes of the capacitor 132.

In the above operation, when the percentage of a period during which the transistor 11 is on is high, current flowing through the coil 131 becomes larger. Accordingly, voltage generated between the terminals of the coil 131 is high when the transistor 11 is turned off, which allows the boosting in the voltage so that a difference between the output potential and the input potential is increased. In contrast, as the percentage of a period during which the transistor 11 is off is increased, current flowing through the coil 131 becomes smaller. Accordingly, voltage generated between the terminals of the coil 131 is low when the transistor 11 is turned off, which allows the boosting in the voltage so that a difference between the output potential and the input potential is decreased.

Figure 12A:
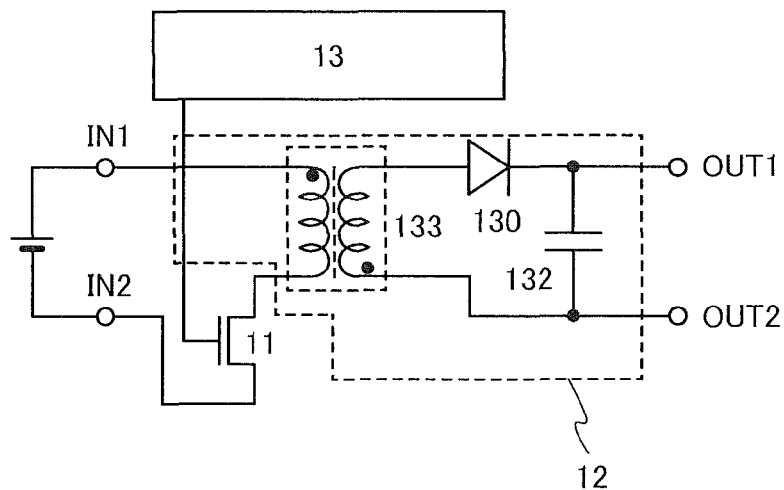
FIGS. 12A and 12B illustrate configuration examples of a DC-DC converter.

FIG. 12A illustrates a configuration example of the flyback DC-DC converter 10 of one embodiment of the present invention. In the DC-DC converter 10 in FIG. 12A, the smoothing circuit 12 includes the diode 130, the capacitor 132, and a transformer 133. In addition, the DC-DC converter 10 in FIG. 12A includes an input terminal IN1 to which an input potential is applied, the input terminal IN2 to which a reference potential is applied, the output terminal OUT1, and the output terminal OUT2.

The transformer 133 includes a first coil and a second coil in which a common core is provided for each of the centers of the coils. The transistor 11 controls connection between the input terminal IN2 and one terminal of the first coil in the transformer 133. Specifically, one of a source and a drain of the transistor 11 is connected to the input terminal IN2, and the other of the source and the drain of the transistor 11 is connected to the one terminal of the first coil in the transformer 133. The other terminal of the first coil in the transformer 133 is connected to the input terminal IN1.

One terminal of the second coil in the transformer 133 is connected to an anode of the diode 130 and the other terminal of the second coil is connected to the output terminal OUT2. A cathode of the diode 130 is connected to the output terminal OUT1. One of a pair of electrodes of the capacitor 132 is connected to the output terminal OUT1 and the other of the pair of electrodes of the capacitor 132 is connected to the output terminal OUT2.

Figure 12B:
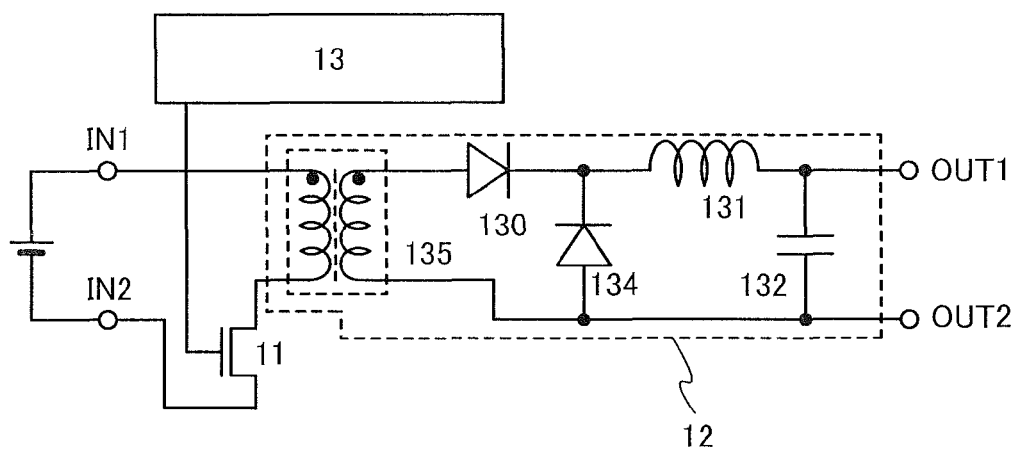

FIG. 12B illustrates a configuration example of the forward DC-DC converter 10 of one embodiment of the present invention. In the DC-DC converter 10 in FIG. 12B, the smoothing circuit 12 includes the diode 130, a diode 134, the coil 131, the capacitor 132, and a transformer 135. In addition, the DC-DC converter 10 in FIG. 12B includes the input terminal IN1 to which an input potential is applied, the input terminal IN2 to which a reference potential is applied, the output terminal OUT1, and the output terminal OUT2.

Like the transformer 133 in FIG. 12A, the transformer 135 includes a first coil and a second coil in which a common core is provided for each of the centers of the coils. Note that in the transformer 133, the start end of the first coil and the start end of the second coil are on the opposite side to each other; in contrast, the start end of the first coil and the start end of the second coil are on the same side in the transformer 135.

The transistor 11 controls connection between the input terminal IN2 and one terminal of the first coil in the transformer 135. Specifically, one of a source and a drain of the transistor 11 is connected to the input terminal IN2, and the other of the source and the drain of the transistor 11 is connected to the one terminal of the first coil in the transformer 135. The other terminal of the first coil in the transformer 135 is connected to the input terminal IN1.

One terminal of the second coil in the transformer 135 is connected to an anode of the diode 130 and the other terminal of the second coil is connected to the output terminal OUT2. A cathode of the diode 130 is connected to a cathode of the diode 134 and the one terminal of the coil 131. An anode of the diode 134 is connected to the output terminal OUT2. The other terminal of the coil 131 is connected to the output terminal OUT1. One of a pair of electrodes of the capacitor 132 is connected to the output terminal OUT1 and the other of the pair of electrodes of the capacitor 132 is connected to the output terminal OUT2.

FIG. 13A illustrates one mode of a light-emitting device which is a semiconductor device. The light-emitting device in FIG. 13A includes an AC power source 301, a switch 302, a rectification circuit 303, the DC-DC converter 10, and a light-emitting element 304. The rectification circuit 303 and the DC-DC converter 10 form a power supply circuit.

Specifically, in the light-emitting device in FIG. 13A, AC voltage from the AC power source 301 is applied to the rectification circuit 303 through the switch 302, and rectified. DC voltage obtained by the rectification is input to the DC-DC converter 10 and output after the level is adjusted. The above description can be referred to for specific configuration and operation of the DC-DC converter 10.

The voltage output from the DC-DC converter 10 is applied to the light-emitting element 304, so that the light-emitting element 304 emits light. As the light-emitting element 304, various light sources such as a light-emitting diode and an organic light-emitting element can be used.

Although the light-emitting device in which the AC power source 301 is used as a power source is illustrated in FIG. 13A, the present invention is not limited to this configuration. As the power source, a DC power source may be used instead of the AC power source. Note that in the case of using the DC power source, the rectification circuit 303 is not necessarily provided.

In addition, although the configuration of the light-emitting device in which the AC power source 301 is used as a power source is illustrated in FIG. 13A, the light-emitting device of one embodiment of the present invention does not necessarily include a power source as its component.

FIG. 13B illustrates one mode of a configuration of a solar cell which is a semiconductor device.

The solar cell in FIG. 13B includes a photodiode 350, a switch 351, a capacitor 352, the DC-DC converter 10, a pulse width modulation circuit 353, an inverter 354, and a band pass filter 355.

Specifically, in the solar cell in FIG. 13B, voltage is generated when the photodiode 350 is irradiated with light. The voltage is smoothed by the capacitor 352 and then input to the DC-DC converter 10 through the switch 351. Note that with the capacitor 352, a pulsed current generated by the switching of the switch 351 can be prevented from flowing into the photodiode 350.

Then, the voltage input to the DC-DC converter 10 is output after the level of the voltage is adjusted by the DC-DC converter 10. The above description can be referred to for specific configuration and operation of the DC-DC converter 10.

The voltages output from the output terminals OUT1 and OUT2 of the DC-DC converter 10 are DC voltages. The inverter 354 converts the DC voltage output from the DC-DC converter 10 into AC voltage, and outputs the AC voltage. FIG. 13B illustrates an example in which the inverter 354 includes four transistors 356, 357, 358, and 359 and four diodes 360, 361, 362, and 363.

Specifically, one of a source and a drain of the transistor 356 is connected to the output terminal OUT1 of the DC-DC converter 10, and the other of the source and the drain of the transistor 356 is connected to one of a source and a drain of the transistor 357. The other of the source and the drain of the transistor 357 is connected to the output terminal OUT2 of the DC-DC converter 10. One of a source and a drain of the transistor 358 is connected to the output terminal OUT1 of the DC-DC converter 10, and the other of the source and the drain of the transistor 358 is connected to one of a source and a drain of the transistor 359. The other of the source and the drain of the transistor 359 is connected to the output terminal OUT2 of the DC-DC converter 10. The diodes 360 to 363 are connected in parallel to the transistors 356 to 359, respectively. Specifically, the one of the sources and the drains of the transistors 356 to 359 are connected to anodes of the diodes 360 to 363, respectively. The other of the sources and the drains of the transistors 356 to 359 are connected to cathodes of the diodes 360 to 363, respectively.

To the pulse width modulation circuit 353, the voltage output from the DC-DC converter 10 is applied. The pulse width modulation circuit 353 is operated by application of the voltage and generates a signal for controlling switching of the transistors 356 to 359.

The transistors 356 to 359 perform switching in accordance with the signal from the pulse width modulation circuit 353, whereby AC voltage with a PWM waveform is output from nodes included in the inverter 354, i.e., a node in which the other of the source and the drain of the transistor 356 and the one of the source and the drain of the transistor 357 are connected and a node in which the other of the source and the drain of the transistor 358 and the one of the source and the drain of the transistor 359 are connected.

Then, a high-frequency component is removed from the AC voltage output from the inverter 354 by using the band pass filter 355, whereby AC voltage with a sine wave can be obtained.

<Electronic Device>

With the use of the DC-DC converter or any of the semiconductor devices of one embodiment of the present invention, an electronic device with low power consumption can be provided. Particularly in the case of a portable electronic device which has difficulty in continuously receiving power, an advantage in increasing the continuous duty period can be provided when the DC-DC converter or any of the semiconductor devices of one embodiment of the present invention is added as a component of the device.

The DC-DC converter or any of the semiconductor devices of one embodiment of the present invention can be used in display devices, laptop personal computers, or image reproducing devices provided with recording media (typically, devices which reproduce the content of recording media such as digital versatile discs (DVDs) and have displays for displaying the reproduced images). In addition, as electronic devices which can utilize the DC-DC converter or any of the semiconductor devices of one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 14A to 14F illustrate specific examples of these electronic devices.

Figure 14A:
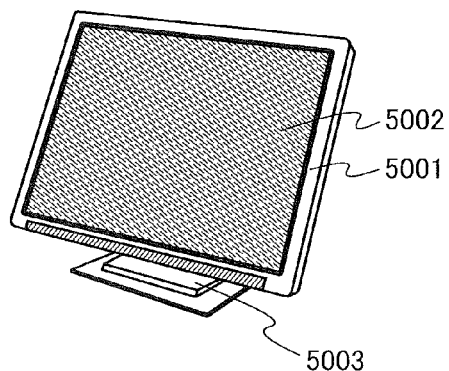
FIGS. 14A to 14F each illustrate an electronic device.

FIG. 14A illustrates a display device including a housing 5001, a display portion 5002, a supporting base 5003, and the like. The DC-DC converter of one embodiment of the present invention can be used in an integration circuit for controlling the driving of the display device. Note that the display device includes, in its category, all the display devices for displaying information, such as display devices for a personal computer, TV broadcast reception, advertisement display, and the like.

Figure 14B:
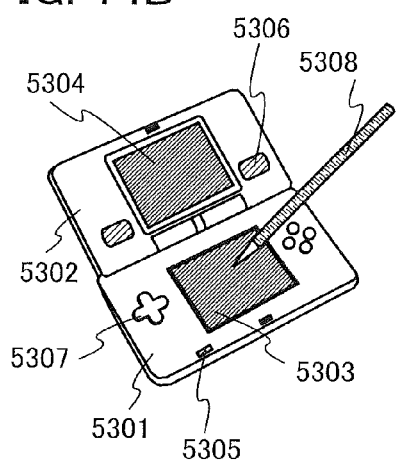

FIG. 14B illustrates a portable game machine including a housing 5301, a housing 5302, a display portion 5303, a display portion 5304, a microphone 5305, a speaker 5306, an operation key 5307, a stylus 5308, and the like. The DC-DC converter of one embodiment of the present invention can be used in an integrated circuit which controls the driving of the portable game machine. Note that although the portable game machine illustrated in FIG. 14B includes the two display portions 5303 and 5304, the number of display portions included in the portable game machine is not limited to two.

Figure 14C:
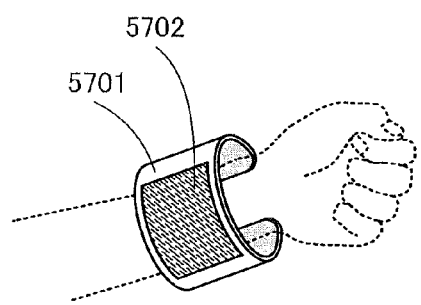

A display device illustrated in FIG. 14C includes a housing 5701 with a curved surface, a display portion 5702, and the like. The DC-DC converter of one embodiment of the present invention can be used in an integrated circuit for controlling the driving of the display device. Note that the use of a flexible substrate in the DC-DC converter of one embodiment of the present invention allows the DC-DC converter to be used in the display portion 5702 supported by the housing 5701 with a curved surface; thus, a user-friendly display device that is flexible and lightweight can be provided.

Figure 14D:
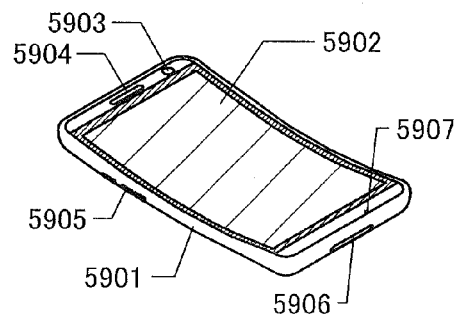

FIG. 14D illustrates a mobile phone. In the mobile phone, a display portion 5902, a microphone 5907, a speaker 5904, a camera 5903, an external connection portion 5906, and an operation button 5905 are provided in a housing 5901. The DC-DC converter of one embodiment of the present invention can be used in an integrated circuit which controls the driving of the mobile phone. Furthermore, when the DC-DC converter of one embodiment of the present invention is formed over a flexible substrate, it can be used in the display portion 5902 having a curved surface as illustrated in FIG. 14D.

Figure 14E:
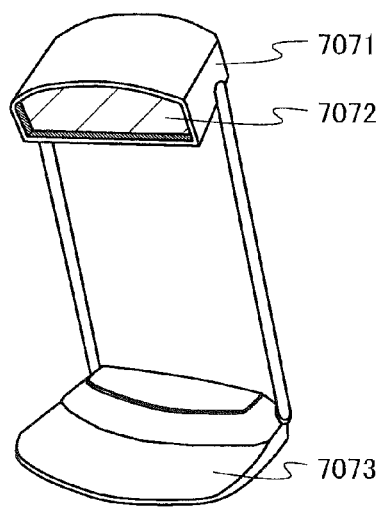

A desk lamp illustrated in FIG. 14E includes a housing 7071, a light source 7072, a supporting base 7073, and the like. The DC-DC converter of one embodiment of the present invention can be used in an integration circuit for controlling the driving of the desk lamp. In addition, the light-emitting device which is one of the semiconductor devices of one embodiment of the present invention can be used for the light source 7072 and a driving circuit for controlling the operation of the light source 7072. The use of the DC-DC converter or any of the semiconductor devices of one embodiment of the present invention allows the desk lamp to have low power consumption.

Figure 14F:
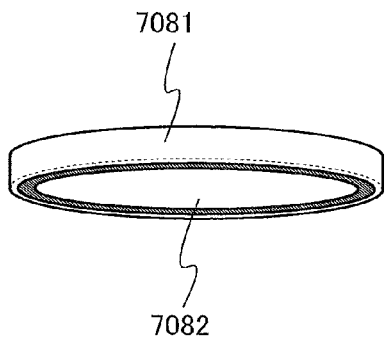

An installation lamp illustrated in FIG. 14F includes a housing 7081, a light source 7082, and the like. The DC-DC converter of one embodiment of the present invention can be used in an integration circuit for controlling the driving of the installation lamp. Furthermore, the light-emitting device which is one of the semiconductor devices of one embodiment of the present invention can be used for the light source 7082 and a driving circuit for controlling the operation of the light source 7082. The use of the DC-DC converter or any of the semiconductor devices of one embodiment of the present invention allows the installation lamp to have low power consumption.

This application is based on Japanese Patent Application serial no. 2013-159086 filed with Japan Patent Office on Jul. 31, 2013, the entire contents of which are hereby incorporated by reference.

What is claimed is:

1. A semiconductor device comprising:
an operational amplifier;
a first transistor; and
a second transistor over the first transistor with an insulating film interposed therebetween,
wherein an output terminal of the operational amplifier is electrically connected to a gate of the first transistor,
wherein a first terminal of the first transistor is electrically connected to an output terminal of the semiconductor device,
wherein a first terminal of the second transistor is electrically connected to the operational amplifier,
wherein the first transistor comprises a first oxide semiconductor film comprising a channel formation region, and
wherein the second transistor comprises a second oxide semiconductor film comprising a channel formation region.

2. The semiconductor device according to claim 1,
wherein the operational amplifier is configured to generate a control signal supplied to the gate of the first transistor,
wherein the first transistor is configured to supply a voltage from the output terminal of the semiconductor device, and
wherein the second transistor is configured to hold a bias potential supplied to the operational amplifier.

3. The semiconductor device according to claim 2, further comprising a capacitor,
wherein the capacitor is configured to hold a charge corresponding to the bias potential.

4. The semiconductor device according to claim 1, further comprising a coil between the first terminal of the first transistor and the output terminal of the semiconductor device.

5. The semiconductor device according to claim 4, further comprising a diode between the first terminal of the first transistor and a second output terminal of the semiconductor device,
wherein a second terminal of the first transistor is electrically connected to a power source.

6. The semiconductor device according to claim 1, further comprising a coil between the first terminal of the first transistor and a power source.

7. The semiconductor device according to claim 6, further comprising a diode between the first terminal of the second transistor and the output terminal of the semiconductor device,
wherein a second terminal of the first transistor is electrically connected to a second output terminal of the semiconductor device.

8. A semiconductor device comprising:
an operational amplifier;
a first transistor; and
a second transistor over the first transistor with an insulating film interposed therebetween,
wherein an output terminal of the operational amplifier is electrically connected to a gate of the first transistor,
wherein a first terminal of the first transistor is electrically connected to an output terminal of the semiconductor device,
wherein a first terminal of the second transistor is electrically connected to the operational amplifier,
wherein the first transistor comprises a first oxide semiconductor film comprising a channel formation region and a pair of first gate electrodes between which the first semiconductor film is provided, and
wherein the second transistor comprises a second oxide semiconductor film comprising a channel formation region and a pair of second gate electrodes between which the second semiconductor film is provided.

9. The semiconductor device according to claim 8,
wherein the operational amplifier is configured to generate a control signal supplied to the gate of the first transistor,
wherein the first transistor is configured to supply a voltage from the output terminal of the semiconductor device, and
wherein the second transistor is configured to hold a bias potential supplied to the operational amplifier.

10. The semiconductor device according to claim 9, further comprising a capacitor,
wherein the capacitor is configured to hold a charge corresponding to the bias potential.

11. The semiconductor device according to claim 8, further comprising a coil between the first terminal of the first transistor and the output terminal of the semiconductor device.

12. The semiconductor device according to claim 11, further comprising a diode between the first terminal of the first transistor and a second output terminal of the semiconductor device,
wherein a second terminal of the first transistor is electrically connected to a power source.

13. The semiconductor device according to claim 8, further comprising a coil between the first terminal of the first transistor and a power source.

14. The semiconductor device according to claim 13, further comprising a diode between the first terminal of the second transistor and the output terminal of the semiconductor device,
wherein a second terminal of the first transistor is electrically connected to a second output terminal of the semiconductor device.

15. A semiconductor device comprising:
an operational amplifier;
a first transistor; and
a second transistor over the first transistor with an insulating film interposed therebetween,
wherein an output terminal of the operational amplifier is electrically connected to a gate of the first transistor,
wherein a first terminal of the first transistor is electrically connected to an output terminal of the semiconductor device,
wherein a first terminal of the second transistor is electrically connected to the operational amplifier,
wherein the first transistor comprises a first oxide semiconductor film comprising a channel formation region,
wherein the second transistor comprises a second oxide semiconductor film comprising a channel formation region,
wherein the first oxide semiconductor film comprises at least one of In and Zn,
wherein the second oxide semiconductor film comprises In, M, and Zn, and
wherein M is at least one of Ga, Y, Zr, La, Ce, and Nd.

16. The semiconductor device according to claim 15,
wherein the operational amplifier is configured to generate a control signal supplied to the gate of the first transistor,
wherein the first transistor is configured to supply a voltage from the output terminal of the semiconductor device, and
wherein the second transistor is configured to hold a bias potential supplied to the operational amplifier.

17. The semiconductor device according to claim 16, further comprising a capacitor,
wherein the capacitor is configured to hold a charge corresponding to the bias potential.

18. The semiconductor device according to claim 15, further comprising a coil between the first terminal of the first transistor and the output terminal of the semiconductor device and a diode between the first terminal of the first transistor and a second output terminal of the semiconductor device,
wherein a second terminal of the first transistor is electrically connected to a power source.

19. The semiconductor device according to claim 15, further comprising a coil between the first terminal of the first transistor and a power source and a diode between the first terminal of the second transistor and the output terminal of the semiconductor device,
wherein a second terminal of the first transistor is electrically connected to a second output terminal of the semiconductor device.

* * * * *